United States Patent
Wiesbauer et al.

(10) Patent No.: US 11,879,801 B2
(45) Date of Patent: Jan. 23, 2024

(54) ENVIRONMENTAL SENSOR

(71) Applicant: Infineon Technologies AG, Neubiberg (DE)

(72) Inventors: Andreas Wiesbauer, Poertschach (AT); Alessandro Caspani, Villach (AT); Christian Jenkner, Klagenfurt (AT); Athanasios Kollias, Munich (DE)

(73) Assignee: Infineon Technologies AG, Neubiberg (DE)

( * ) Notice: Subject to any disclaimer, the term of this patent is extended or adjusted under 35 U.S.C. 154(b) by 50 days.

(21) Appl. No.: 17/660,135

(22) Filed: Apr. 21, 2022

(65) Prior Publication Data

US 2022/0381635 A1 Dec. 1, 2022

(30) Foreign Application Priority Data

May 31, 2021 (EP) .................................. 21176951.8

(51) Int. Cl.
*G01L 19/00* (2006.01)
*G01L 9/02* (2006.01)
(52) U.S. Cl.
CPC .......... *G01L 9/025* (2013.01); *G01L 19/0061* (2013.01); *G01L 2019/0053* (2013.01)
(58) Field of Classification Search
None
See application file for complete search history.

(56) References Cited

U.S. PATENT DOCUMENTS

| 6,996,488 B2* | 2/2006 | Chu ........................ G01L 9/025 341/120 |
| 7,010,983 B2* | 3/2006 | Albert .................... G01D 3/022 73/714 |
| 8,446,220 B2 | 5/2013 | Rozgo et al. |
| 8,860,593 B2 | 10/2014 | Kimura et al. |
| 11,422,044 B2* | 8/2022 | Zamprogno ............. G01D 5/16 |

* cited by examiner

*Primary Examiner* — Peter J Macchiarolo
*Assistant Examiner* — Jermaine L Jenkins
(74) *Attorney, Agent, or Firm* — Slater Matsil, LLP

(57) ABSTRACT

A controller for an environmental sensor provides digital environmental measurement values from analog environmental measurements performed by analog circuitry, the digital environmental measurement values lying in a global scale range. The controller subjects the global scale range to a subdivision into scale subranges that are proper subranges of the global scale range. The controller selects, among the scale subranges, one scale subrange in which an analog environmental measurement is to be performed, selects an offset information and a gain information that are associated with the selected scale subrange and that are indicative of an offset and a gain to be applied by the analog circuitry to perform an analog environmental measurement in the selected scale subrange, and to provide the offset information and the gain information to the analog circuitry.

17 Claims, 13 Drawing Sheets

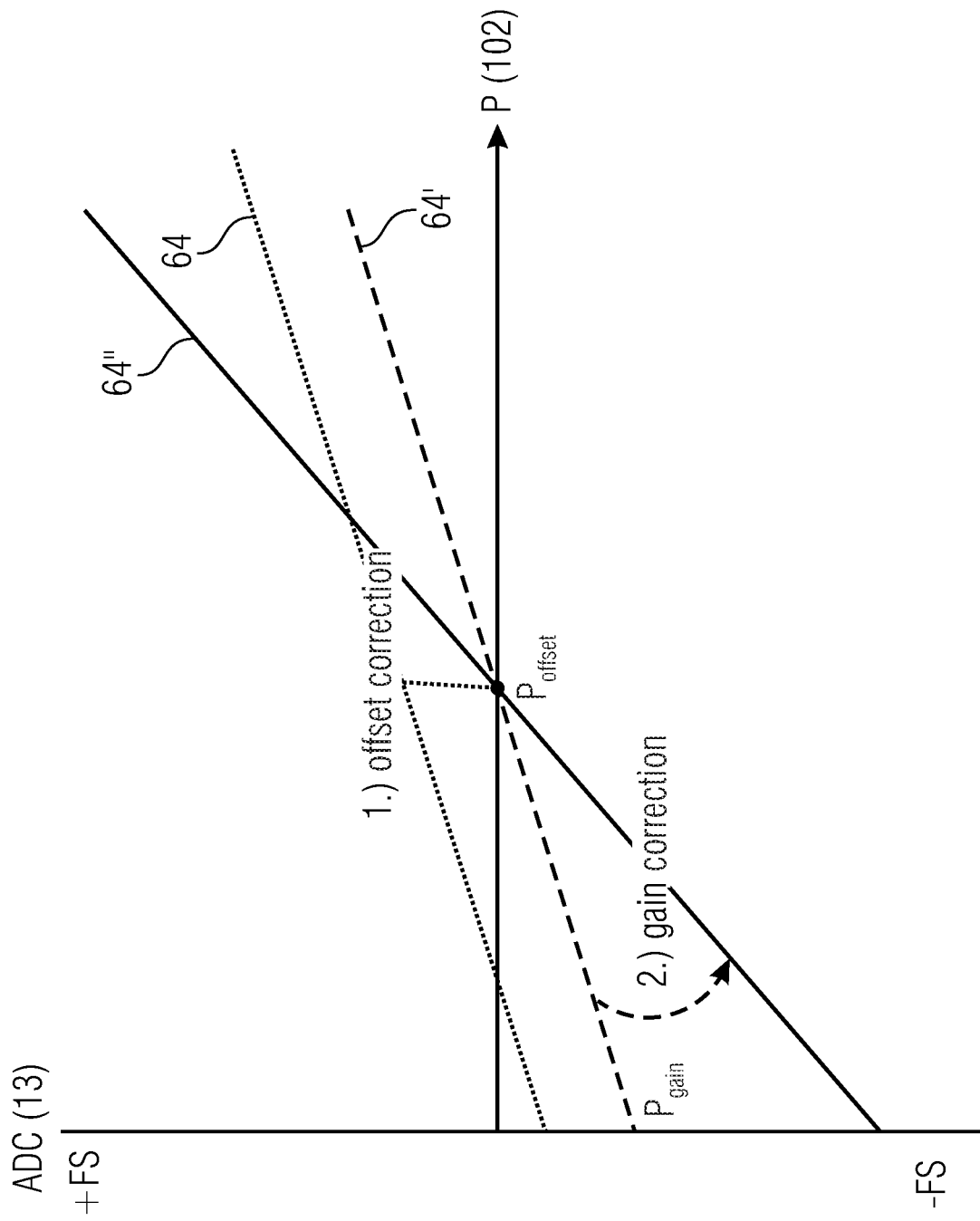

ENVIRONMENTAL SENSOR

This application claims the benefit of European Patent Application No. 21176951, filed on May 31, 2021, which application is hereby incorporated herein by reference.

TECHNICAL FIELD

The present examples mainly refer to a sensor, such as an environmental sensor, to measure an environmental magnitude (e.g., pressure), a controller controlling the environmental sensor, an associated method, and non-transitory storage unit storing instructions which, when executed by a processor, cause the processor to perform the method.

BACKGROUND

In an environmental sensor it is in general preferable to reduce the noise of the measurement, to increase the efficiency, and to increase accuracy, and to reduce the necessary hardware equipment.

The environmental magnitude which is measured may in general be in different values, which may also greatly differ from each other. In some prior art examples, different analog circuits are used for different magnitude ranges, hence increasing the number of the components and their bulkiness.

If the number of analog circuit is kept low, noise is in general increased. In particular when an amplifier is used, the amplifier can be impaired by non-linearities, and this negative effect increases with large gains (saturation). In general terms, it would be preferable to have a high gain at the amplifier, but this is not possible because of the saturation.

In order to reduce the noise, oversampling techniques are in general performed, which notwithstanding increase the power consumption, reducing efficiency.

In some cases, it would be preferable to have different gains for different ranges of the magnitude, but this is in general not achievable.

Also increase of resolution and accuracy is pursued.

SUMMARY

In accordance to an aspect, there is provided a controller for an environmental sensor, the environmental sensor providing digital environmental measurement values from analog environmental measurements performed by analog circuitry, the digital environmental measurement values lying in a global scale range or wide scale range, wherein the controller is configured to subject the global scale range or wide scale range to a subdivision into a plurality of scale subranges which are proper subranges of the global scale range or wide scale range, wherein the plurality of scale subranges includes at least one first and one second scale subranges, wherein the first scale subrange is different from one second scale subrange, the first scale subrange is not a proper subrange of the second scale subrange, and the second scale subrange is not a proper subrange of the first scale subrange, the controller being configured to:
 select, among the plurality of scale subranges, one scale subrange in which an analog environmental measurement is to be performed,
 select an offset information and a gain information which are associated with the selected scale subrange and which are indicative of an offset and a gain, respectively, to be applied by the analog circuitry to perform an analog environmental measurement in the selected scale subrange; and
 provide the offset information and the gain information to the analog circuitry.

In addition or in alternative, there is provided an environmental sensor for providing digital measurement values of environmental magnitudes, comprising:
 an analog circuitry, configured to provide analog environmental measurement values of environmental magnitudes obtained through measurements performed at least in one of the plurality of scale subranges;
 an analog-to-digital converter, ADC, unit, configured to convert the analog environmental measurement values onto digital versions of the analog environmental measurement values;
 a controller as above and/or as below, configured to:
 select, among the plurality of scale subranges, the one scale subrange in which the at least one analog environmental measurement is to be performed,
 select the offset information and the gain information which are associated with the selected scale subrange and which describe the offset and the gain, respectively, to be applied by the analog circuitry to perform the at least one second analog environmental measurement in the selected scale subrange; and
 provide the offset information and the gain information to the analog circuitry,
 so that the analog circuitry applies the offset and the gain to the second analog environmental measurement in the selected scale subrange, so as to obtain at least one analog environmental measurement value lying in the selected scale subrange and a digital version of the at least one analog environmental measurement value lying in the selected scale subrange.

Accordingly, it is possible to choose, for different magnitudes to be measured, different scale subranges, hence ameliorating accuracy and resolution. Further, the gain may be increased since its saturation effects, for a narrower scale range, are less important.

In accordance to an aspect, the selected gain information may control at least one gain of an amplifier unit amplifying an analog environmental measurement, by applying the selected gain to perform the analog environmental measurement in the selected subrange.

Accordingly, the most preferable gain (e.g., a high gain) may be chosen.

In accordance to an aspect, the selected gain information controls at least one capacitor connecting an input terminal of the amplifier unit and an output terminal of the amplifier unit.

In particular the analog circuitry may comprise an amplifier to amplify an analog environ-mental measurement, and a variable feedback capacitor connecting an input terminal of the amplifier to an output terminal of the amplifier, wherein the gain information controls the capacitance of the variable feedback capacitor, so that an increase of the gain is caused by a reduction of the capacitance of the variable feedback capacitor.

Accordingly, a variable gain may be obtained.

Accordingly, the most preferable gain (e.g., a high gain) may be chosen.

In accordance to an aspect, it is possible to perform a selection between:
 a broad-subrange mode or no-subrange mode in which at least one first analog environmental measurement can be performed; and a narrow-subrange mode in which the at least one second analog environmental measurement can be performed, wherein in the broad-subrange mode or no-subrange mode the global scale range or wide scale range is subdivided in less scale subranges than in the narrow-subrange mode, or not subdivided in scale subranges at all, respectively, and at least the majority of the scale subranges in the broad-subrange mode or no-subrange mode is broader than the scale subranges in the narrow-subrange mode.

It is possible to have a gain information indicative of a first gain in the broad-subrange mode or no-subrange mode, and to apply a second gain information indicative of a second gain in the narrow-subrange mode for the second analog environmental measurement, wherein the second gain is higher than the first gain.

Accordingly, in the broad-subrange mode or no-subrange mode the gain is kept low (to avoid non-linearities), and in the narrow-subrange mode the gain is kept higher, since the non-linearities are less important.

In accordance to an aspect, it is possible to perform a calibration session in which a plurality of analog environmental measurements are performed and a plurality of resulting analog environmental measurement values are compared with expected values and the gain information and the offset information are iteratively varied, to obtain the offset information and the gain information for at least one scale subrange of the plurality of scale subranges.

In the calibration session there may be obtained the offset information and the gain information to be subsequently applied for performing analog environmental measurements in a given scale subrange, the calibration session comprising:

an offset trimming cycle in which at least one first known environmental magnitude is applied, the offset trimming cycle including performing measurements on the at least one known environmental magnitude and comparing the obtained measurement values to an expected value, so as to obtain the offset information;

a gain trimming cycle in which at least one second known environmental magnitude, different from the at least one first known environmental magnitude, is applied, the gain trimming cycle including performing measurements on the at least one second known environmental magnitude and comparing the obtained measurement values to an expected value, so as to obtain the gain information, wherein both the at least one first known environmental magnitude and the at least one second known environmental magnitude lie in the given scale subrange.

Accordingly, it is possible to know which are the offset and the gain to be applied by the analog circuitry for each scale subrange.

In accordance to an aspect, the selected offset information may control a variable impedance in the analog circuitry, so as to apply the offset which causes the analog environmental measurement to be performed in the selected scale subrange.

Accordingly, it is possible to easily change the offset, without using multiple, different circuits (e.g., we may have one single bridge, but the offset is modified so as to have different offsets).

In accordance to an aspect, the analog circuitry may comprise an impedance bridge having a first branch with a first pair of impedance elements and a second branch with a second pair of impedance elements, wherein at least one of the impedance elements is a sensor impedance element configured to transduce an environmental magnitude onto an impedance-related parameter, and at least one of the impedance elements of the first branch and at least one of the impedance elements of the second branch is a reference impedance element, wherein the impedance bridge presents a first output terminal at the first branch between the impedance elements of the first pair and a second output terminal at the second branch between the impedance elements of the second pair, so as to provide a differential signal which is an analog environmental measurement value of the environmental magnitude, wherein at least one of the reference impedance elements, or an impedance element in series or in parallel to at least one of the reference impedance elements or sensor impedance elements, is selectably modifiable according to the offset information, so as to apply the offset.

In accordance to an aspect, it is possible to provide an oversampling rate information indicative of an oversampling rate of the analog-to-digital converter, ADC, so that an increased gain corresponds to a reduced oversampling rate, and a reduced gain corresponds to an increased oversampling rate. The ADC unit may be configured to operate at a first averaging mode which implies a lower oversampling rate in the narrow scale subrange mode than the oversampling rate in the broad-subrange mode or no-subrange mode.

Accordingly, a high gain permits to reduce the oversampling and, therefore, to reduce the power consumption.

In accordance to an aspect, there is provided a method for providing digital measurements from analog environmental measurements acquired by analog circuitry, the digital measurements lying in a global scale range or wide scale range, wherein the global scale range or wide scale range is subjected to a subdivision into a plurality of scale subranges which are proper subranges of the global scale range or wide scale range, wherein the scale subranges are such that one first scale subrange is different from one second scale subrange and the first scale subrange is not a proper subrange of the second scale subrange and the second scale subrange is not a proper subrange of the first scale subrange, the method comprising:

selecting, among the plurality of scale subranges, one scale subrange in which at least one second analog environmental measurement value is to be acquired, selecting an offset information and a gain information which are associated with the selected scale subrange and which describe an offset and a gain, respectively, to be applied by the analog circuitry to perform a second analog environmental measurement in the selected scale subrange; and providing the offset information and the gain information to the analog circuitry.

In accordance to an aspect, there is provided a non-transitory storage unit storing instructions which, when executed by a computer (processor), cause the computer to perform the method above.

BRIEF DESCRIPTION OF THE DRAWINGS

FIGS. 5*a*-5*e* show graphics of measurement functions according to examples FIG. 6 an environmental sensor according to an example;

DETAILED DESCRIPTION OF ILLUSTRATIVE EMBODIMENTS

Figure 1:
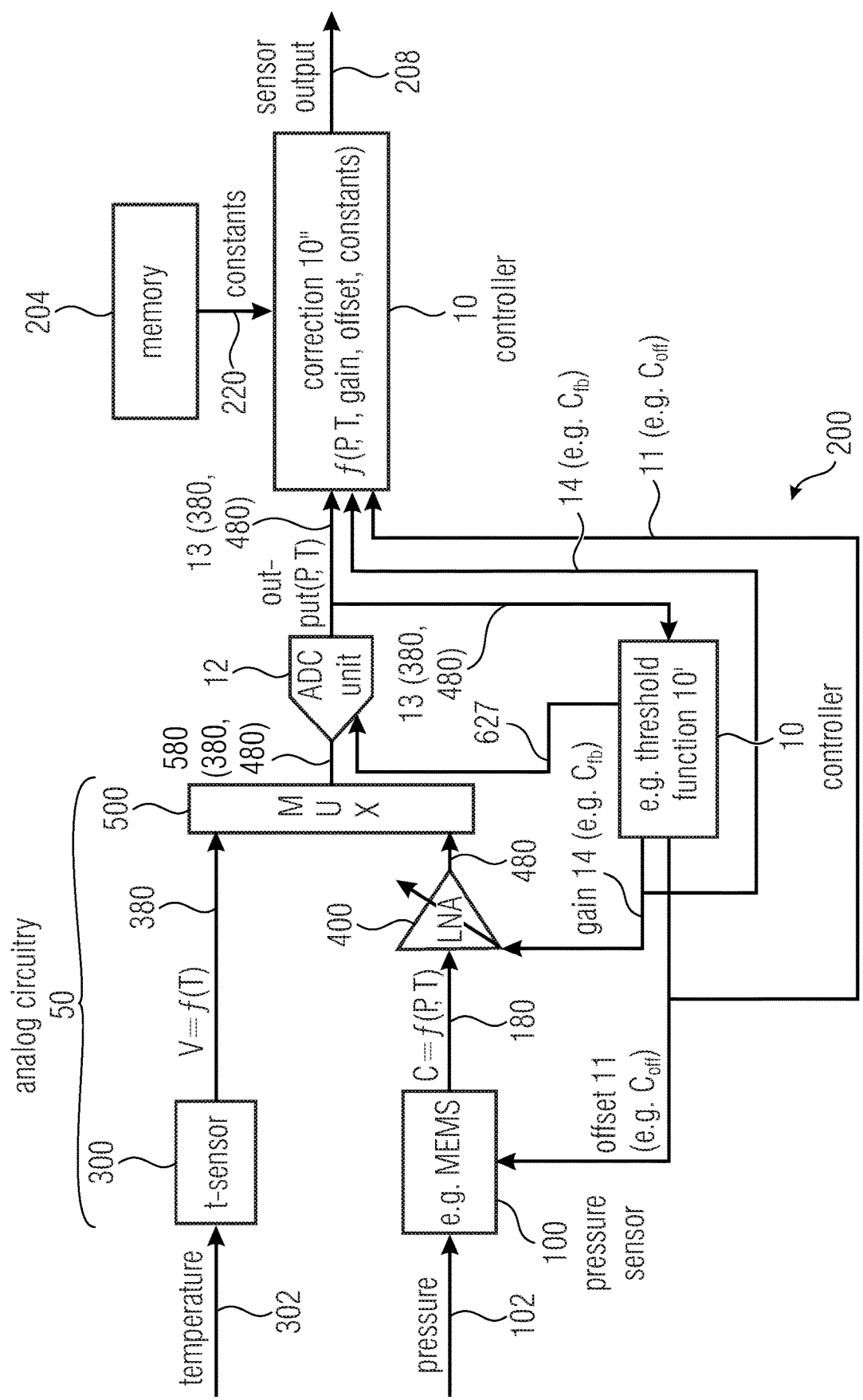
FIG. 1 shows an environmental sensor according to an example.
Figure 2:
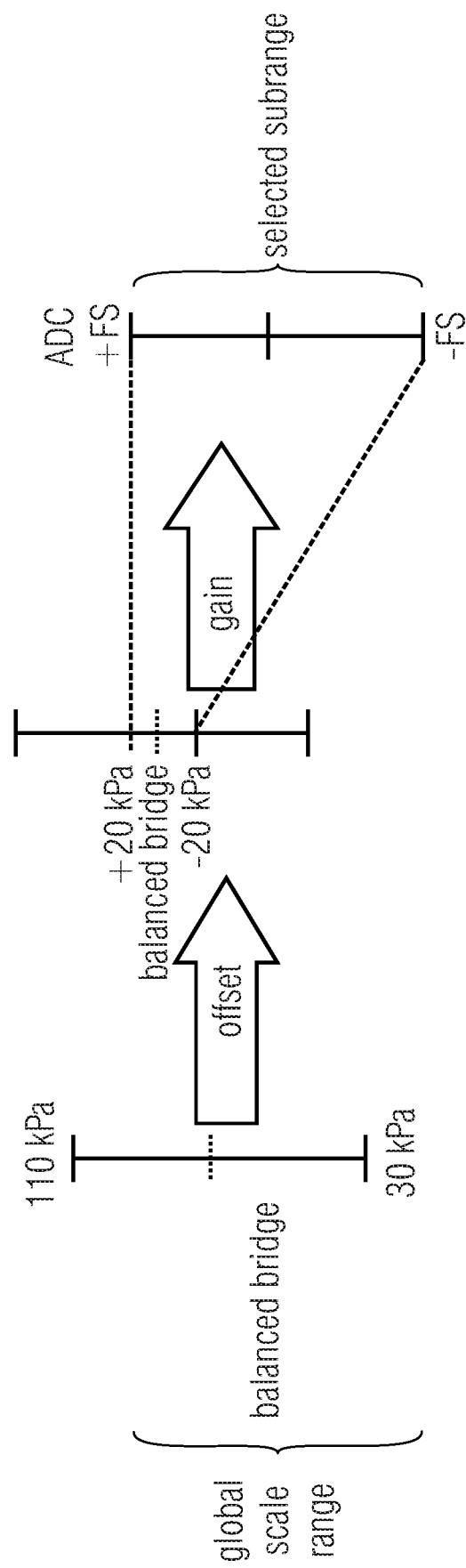
FIG. 2 shows an operation according to an example.
Figure 3:
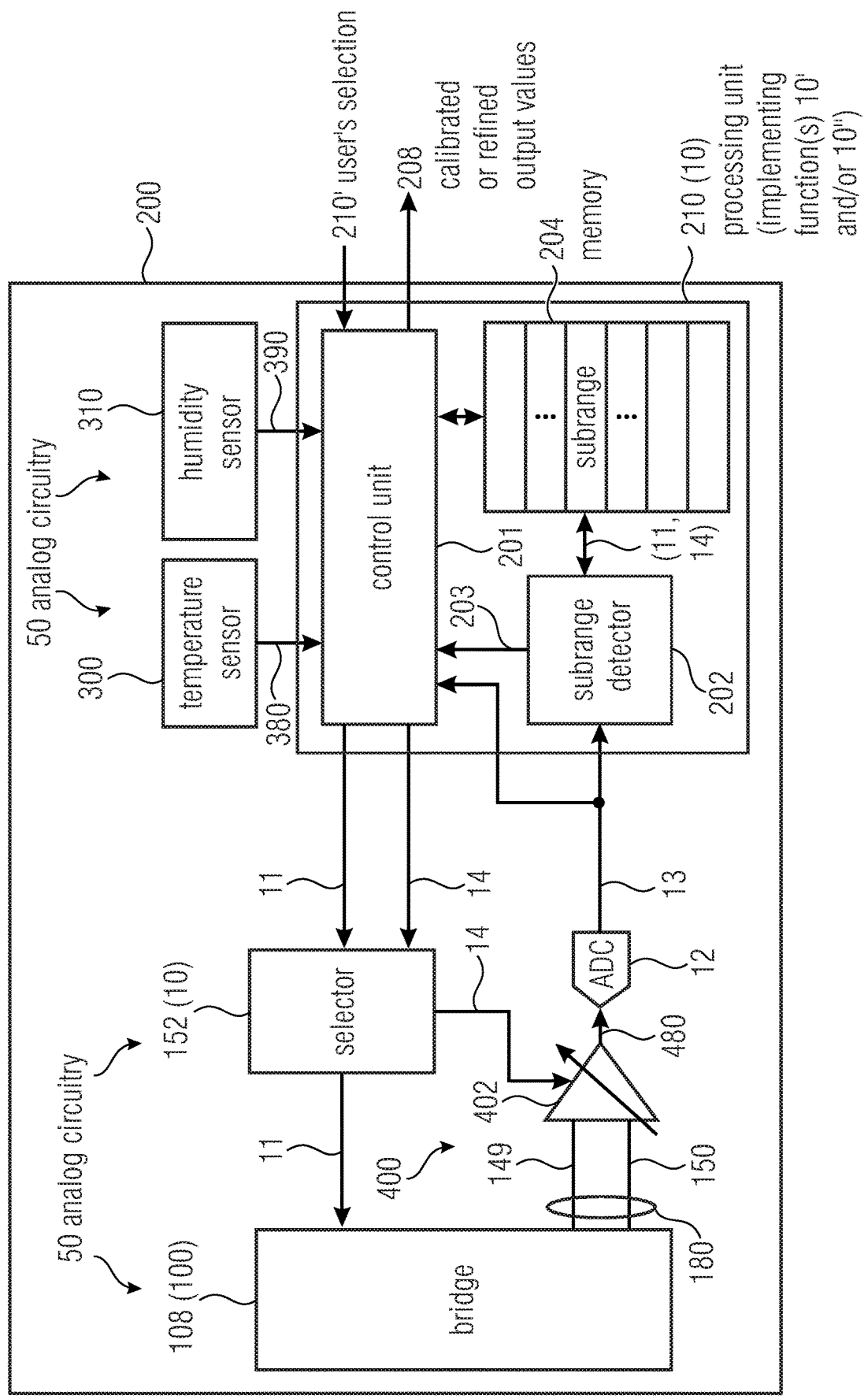
FIGS. 3 and 4 show an environmental sensor according to examples.

FIGS. 1, 3, 4, and 6 shows schematizations of an environmental sensor 200 (they may refer to slightly different aspects or different examples, or some features may be avoided in some figures). The environmental sensor 200 may perform analog environmental measurements, which may provide analog environmental measurement values (e.g., in form of analog signals, e.g., voltage signals), such as those indicated with 180, 380, 480, and/or 580 in FIG. 1 (and those indicated with 180, 480, 380, and/or 390 in FIG. 3, or 180 and 480 in FIGS. 4 and 6). The environmental sensor 200 may provide digital environmental measurement values (e.g., 13, 208 and/or 630 in FIGS. 1, 3, and 4, and 6), which may be, for example, obtained by converting the analog environmental measurement values onto digital versions thereof. Therefore, the environmental sensor 200 may provide a digital measurement 13 (or 208) from analog environmental measurements. The digital version of the analog environmental measurement value (180, 380, 480, 580, 380, 390, etc.) can also be a calibrated, refined and/or corrected version 208 (which may keep into account correction data), as shown in FIGS. 1 and 3.

The environmental sensor 200 may comprise a controller 10, which may control functions of the environment sensor 200. The environmental sensor 200 may include an analog circuitry (analog frontend) 50 which may include components or groups of components (some of components or groups of components are indicated with 100, 300, 400, 500, and so on). The analog environmental measurements may therefore be performed by the analog circuitry 50 and the acquired analog environmental measurement values may be converted into the digital form (e.g., 13 and/or 208) through an analog-to-digital converter unit 12. The controller 10 may control at least one of the components of the analog circuitry 50 (e.g., through at least one of the information 11, 14, 627, etc., which will be discussed below). The controller 10 may control at least one of the digital parts of the environmental sensor 200. In FIG. 1 it is shown that the controller 10 may be inputted with at least the digital version 13 and/or 208 of an analog measurement value 180, 280, 380, 480, 580, and may control a gain (here indicated with 14) and/or an offset (here below indicated with 11) for the analog environmental measurements performed by the analog circuitry 50, and/or oversampling information 627 to control oversampling at the ADC unit 12 (see also below).

FIG. 1 shows that the environmental sensor 200 may include a pressure sensor unit 100 which converts (transduces) a pressure (pressure magnitude) 102 (or another environmental magnitude), sensed in the environment, onto an electric signal 180 (which may be a non-amplified environmental measurement value). The electric signal 180 may be, for example, a voltage. The pressure sensor unit 100 may include a capacitive bridge (or more in general, an impedance bridge) 108 (e.g., one single bridge 108) in which some capacitors (or other kind of impedance elements, such as resistors or other impedance elements) are reference capacitors (or reference impedance elements), e.g. with capacitances (or reference impedances) independent from the pressures (or other environmental magnitude), and some other capacitors (or some other impedance elements) are sensing capacitors (or sensing impedance elements), which modify their capacitance (or impedance) following the pressure (or other environmental magnitude) 102 experienced from the environment. In some cases, as shown in FIG. 1, the signal 180 results from an analogic operation according to a formula such as C=f(P, T), noting that the temperature can also play a role in the capacitance experienced by the capacitors of the pressure sensor unit 100. Notwithstanding, at least in the more general definition of the present examples, the pressure sensor unit 100 is not strictly limited to an impedance bridge. Notably, however, the pressure sensor unit 100 may be constructed so as to operate according to an offset which is provided by the controller 10 through an offset information 11. Therefore, the output 180 of the pressure sensor unit 100 may be conditioned by the offset chosen by the controller 10.

The analog circuitry 50 may include an amplifier unit 400, which may include an amplifier 402 (such as a low noise amplifier, LNA). The amplifier unit 400 may have as input the signal (non-amplified environmental measurement value) 180 outputted by the pressure sensor unit 100, and may provide an amplified version thereof. The gain of the amplification should ideally be constant and unique, but this is in general not guaranteed. The gain which scales the input signal 180 outputted by the pressure sensor unit 100 may be controlled by the controller 10 through the gain information 14.

FIGS. 1 and 3 show that the environmental sensor 200 may also include a temperature sensor unit 300, which may provide an analog environmental measurement value (signal) 380 obtained through an analog (environmental) temperature measurement. This measurement value 380 may be a voltage which is a function of the temperature 320 experienced in the environment. In some examples, the temperature sensor unit 300 may not be present. However, in some examples, the temperature sensor unit 300 may be used for correcting the pressure measurement (for example, the controller 10 may make use of the measured temperature value 380, or its digital version, to correct the pressure measured value 480, or digital version 13 thereof, according to known formulas, to obtain the corrected pressure measurement value 208).

Alternatively or in addition, a humidity sensor may be provided, which provides an analog environmental measurement 390, which gives an environmental measurement of humidity (this is shown, for example, in FIG. 3, as sensor unit 310, but is not shown in FIG. 1). According to a particular model, in fact, the pressure measurement may also be influenced by the humidity according to a formula such as C=f(P,T,H)), with H being the humidity. Hence, also the humidity may be used for correcting the measured temperature value 380, or its digital version, to correct the pressure measured value 480, or digital version 13 thereof, according to known formulas, to obtain the corrected pressure measurement value 208.

In FIG. 1, an analog multiplexer 500 may provide an environmental measurement value 580, which may be either the analog pressure measurement 480 (e.g., as outputted by the amplifier unit 400 which can amplify the analog pressure measurement value 180 output by the pressure sensor unit 100) or the temperature value or the humidity measurement or another measurement. For the purpose of measuring the pressure magnitude 102 and/or the temperature magnitude 302 and/or the humidity magnitude, however, the presence of the multiplexer 500 is not particularly crucial and can be substituted by other means (for example, there could be two ADC units, one for measuring the pressure and one for converting the analog pressure measurement 480 into a digital version of the analog pressure measurement, and one other ADC unit for converting the analog temperature measurement value 380 or the analog humidity sensor) or could even not be present.

The controller 10 may also be considered to have, inter alia, at one of the two following portion:
- a first portion (e.g., implementing at least one threshold function) 10', which may control the offset 11 and/or the gain 14;
- a second portion (e.g., implementing at least one correction function) 10", which may correct the digital version 13 of at least one of the analog measurements 180, 380, 480, 580, e.g., by applying correction data 220 (e.g., pre-stored constants) onto the digital version 13.

The correction function 10" may apply correction data 220 stored in a memory 204. The memory 204 may obtain the correction data 204 during a calibration operation which may be performed in advance (e.g., at some specific time instance). Therefore, the difference between the digital measurement value 13 and the digital measurement value 208 (which may both be understood as digital environmental measurement values) may be, in some examples, that the measurement value 208 has been obtained by correcting the measurement value 13 through correction data 220 stored in the memory 204. As shown in FIG. 1, the digital environmental measurement value 208 may keep into account not only the pressure P as digital environmental measurement value 13, but also the temperature T (e.g. as measured by the temperature sensor unit 300) and/or the humidity, but may also take into account the offset information 11 and the gain information 14.

To the contrary, as shown in FIGS. 5a-5e, the digital measurement value 13 may be understood as being an adimensional value in a measurement range (vertical in FIGS. 5a-5e) between a lower measurement end (indicated with −FS) and a higher measurement range (indicated with +FS). In general terms, FIGS. 5a-5e present measurements curves (transfer functions) which show the relationships between the environmental magnitudes (e.g., pressures) 102 and the digital environmental measurement values 13 as obtained after the conversion onto digital values of the measured analog values 480 (580). It will also be shown that each analog measurement is performed in a particular scale range, which may be, for example, a global scale range or a scale subrange. More in general, a wide scale range may be subdivided onto a plurality of scale subranges (the wide scale range may be the global scale range or a subrange of the global scale range).

Figure 5B:
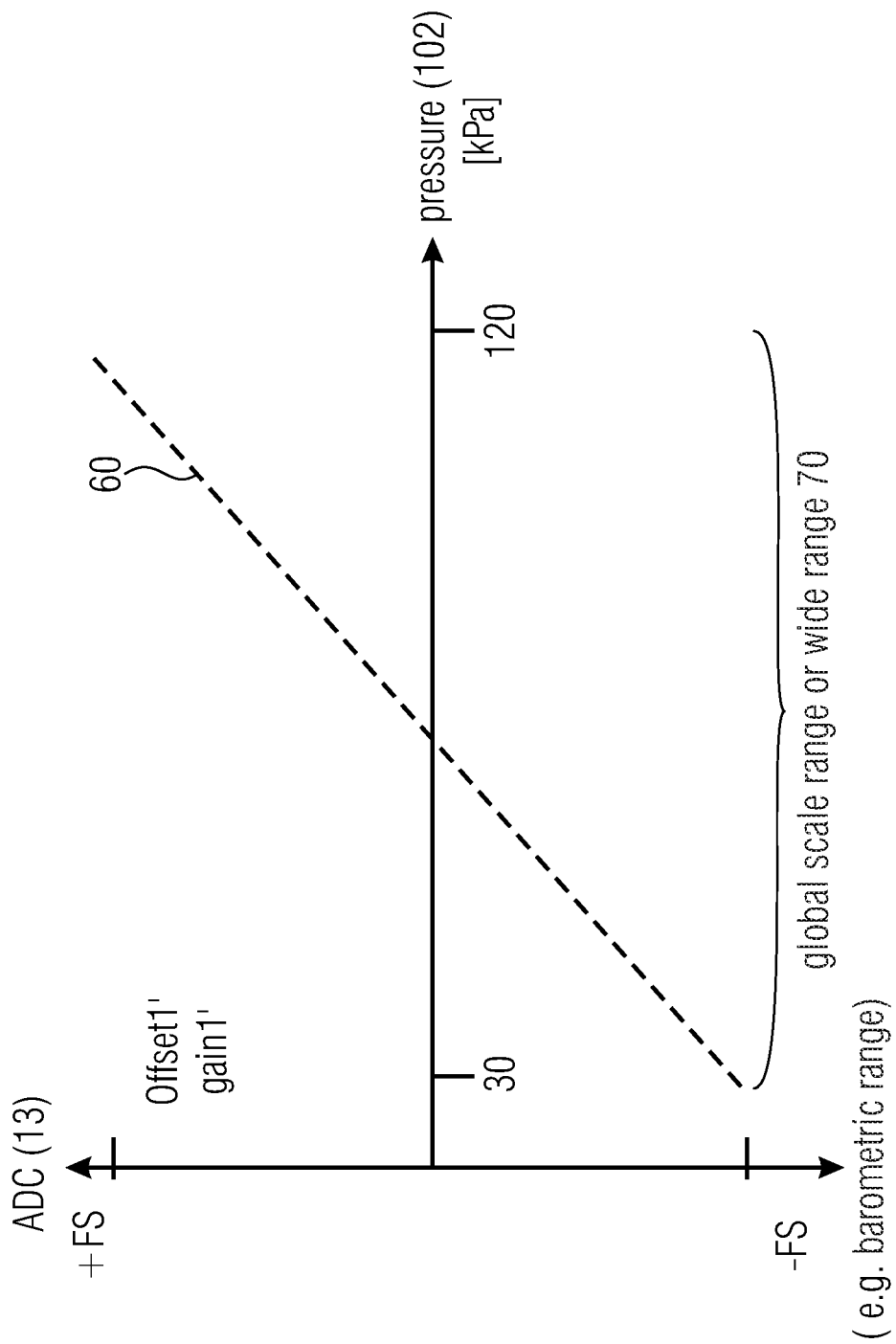

FIG. 5b shows a measurement function (curve) 60, which maps a physical environmental magnitude (e.g., the pressure in kPa) 102 in abscissa (horizontal) onto digital measurement values 13 in ordinate (vertical). In ordinate the measurement range may be between an adimensional minimum value −FS and an adimensional maximum value +FS. The scale range (in abscissa) in FIG. 5b is here a barometric range (e.g., the range of pressures that can be experienced in the terrestrial atmosphere). In some examples, the barometric range 70 of FIG. 5b may be the global scale range and may be subdivided onto a plurality of scale subranges. In some other examples, the barometric range 70 of FIG. 5b may in turn be a scale subrange in a broader range (e.g., a global scale range even broader of the barometric range 70). The barometric range 70 of FIG. 5b is here indicated as having a lower end (e.g., at 30 kPa, kilo pascal), which is here e.g. indicated as being mapped onto −FS, and a higher end (e.g., at 120 kPa, kilo pascal), which is here e.g., indicated as being mapped onto +FS.

As can be seen from FIG. 5b, the measurement function (curve) 60 is represented as a linear relationship between the pressures 102 in the global scale range 70 and the measured values. Notably, the measurement function (curve) 60 has an angular coefficient (slope), which can be understood as being the gain applied by the amplifier unit 400 to the analog measurement value 180. In general terms, the gain is not constant, e.g. due to the fact that the amplifier 402 is not ideal and can present some non-linearities, which tend to render the measurement function (curve) convex or concave.

In order to contain the noise and the power consumption (see also below), the gain should be ideally high. However, a high gain in the amplifier 402 saturates, and therefore tends to exacerbate the non-linearities. Therefore, the gain (at least for the global scale range) cannot be too high, and the measurement function (curve) 60 of FIG. 5b shall in principle have a maximum slope.

Figure 5C:
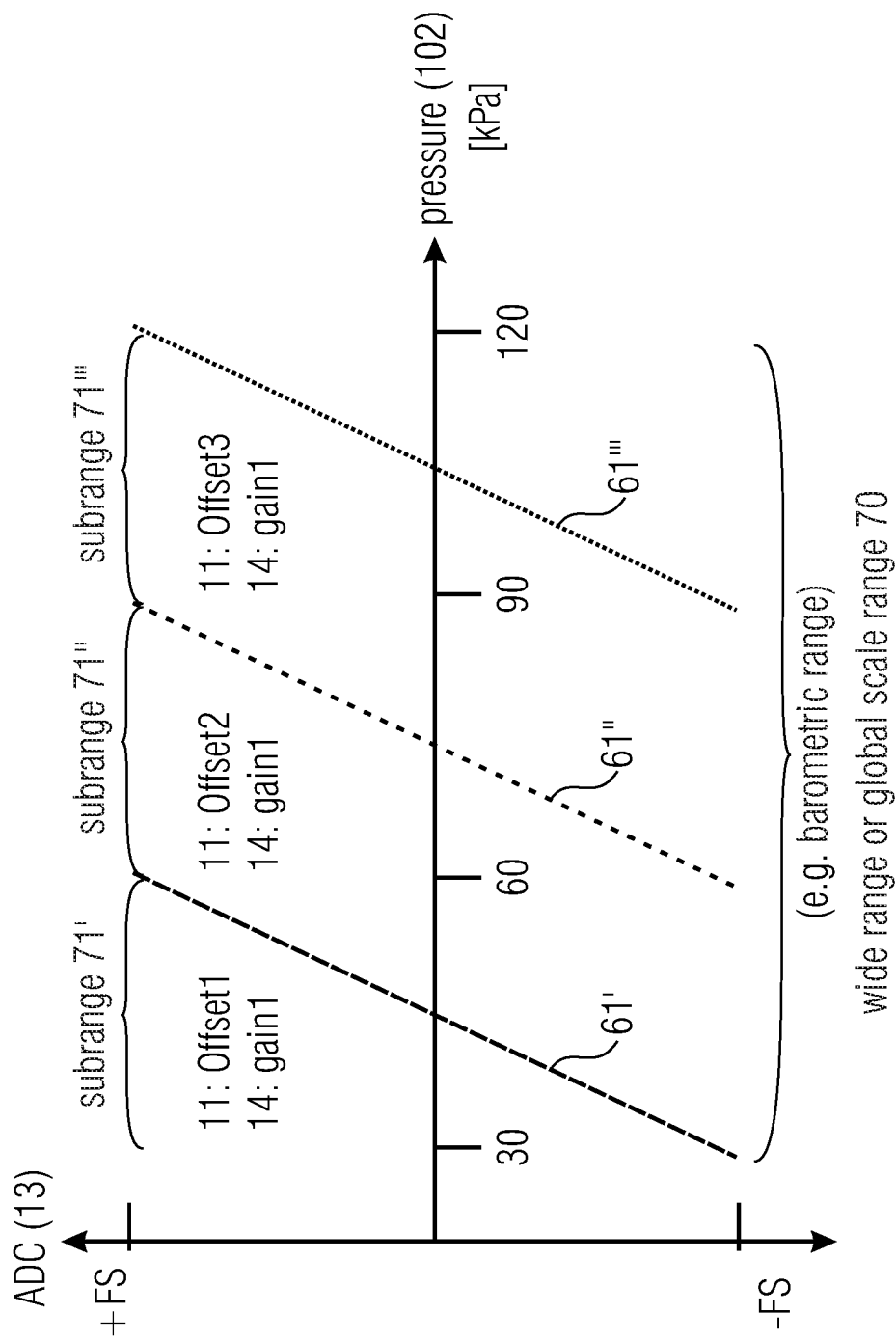

However, it has been understood that it is generally possible to divide the global scale range into a plurality of scale subranges. An example is provided by FIG. 5c, which shows that the barometric range 70 of FIG. 5b (which could be the global scale range) is subdivided into a plurality of scale subranges 71', 71", 71'''. E.g., there may be defined a first scale subrange 71' e.g., between 30 kPa and 60 kPa; a second scale subrange 71" e.g., between 60 kPa and 90 kPa; and a third scale subrange 71''' e.g., between 90 kPa and 120 kPa. Accordingly, there may be several measurement function (curve)s 61', 61" and 61''', which may be understood as substantially parallel to each other and having the same gain 14 (same slope), but having different offsets 11. In particular the measurement function (curve) 61' may have an offset 11 which is indicated as Offset1 and a gain 14 which is indicated as a gains; the measurement function (curve) 61" may have an offset 11 which is indicated as Offset2 (with Offset2≠Offset1) and a gain 14 which is indicated as gain1 (the same of the measurement function 61'); and the measurement function 61''' may have an offset 11 which is indicated as Offset3 (with Offset3≠Offset2, Offset3≠Offset1) and a gain 14 which is indicated to also be gain1 (the same of the measurement functions 61' and 61"). Therefore, it is possible to subdivide the global scale range 70 into a plurality of scale subranges (e.g., 71', 71", 71'''). If the global scale range is the range 70 of FIG. 5b and the scale subranges are the 71', 71", 71''' of FIG. 5c, then we obtain that the gain Gain1 of each of the scale subranges 71', 71", 71''' of FIG. 5c is larger than the gain of the global scale range (barometric range 70), but the non-linearities tend to be negligible. Notably, the gains of the scale subranges 71', 71", 71''' are here indicated as being all equal to one single value Gain1, but there may remain some slight differences due to the non-linearities, which may notwithstanding be corrected by obtaining different gain information 14 for different scale subranges 71', 71", 71''', e.g. by performing a calibration operation discussed below. In general terms, the gains can be different, e.g., because the sensitivity of the MEMS sensor (or more in general of the bridge sensor) 108 over pressure can also not be constant, and it may tend to be less sensitive for low pressures, and higher sensitive for higher pressures.

It is also to be noted that, by performing the measurement in a narrower scale range, the resolution may result ameliorated. As shown in FIGS. 5a-5b, the same adimensional measurement scale between −FS and +FS in FIG. 5c maps a narrower range than in FIG. 5c, which increases the significance of each digit of the value 13, implying a better resolution ("FS" means "full scale").

In some examples, the choice between performing the analog measurement in the global scale range or in one particular scale subrange (which may be understood as the choice between the gain information 14 and/or the offset information 11 which has to be provided to the analog circuitry) is made through a selection (e.g., a user's selection 210' shown in FIG. 3).

In some other examples, the choice is performed by performing a first rough analog measurement in the global scale range (or in a broad or wide scale range) and subsequently performing a second finer analog measurement in a selected scale subrange. If a first analog environmental measurement (e.g., pressure) is first performed using the measurement function 60 of FIG. 5*b* (within the barometric range 70, which may be the global scale range), it is therefore possible to subsequently chose the most appropriated scale subrange 71', 71", or 71''' (FIG. 5*c*), to refine the analog measurement, so as to subsequently perform at least one (but more probably a plurality of) analog measurement(s) using the most appropriated measurement function and the most appropriated scale subrange. For example, if, at a first analog measurement carried out within the global scale range (using the measurement function 60 of FIG. 5*b*) the pressure is measured as being within 30 kPa and 60 kPa, then the measurement can be refined by choosing, as a scale, the first scale subrange 71' (and the first measurement function 61'), to have a more precise measurement of the pressure 102. If, on the other side, at a first rough measurement preformed at the global scale range 70 of FIG. 5*b* (measurement function 60) it is determined that the pressure 102 is between 90 kPa and 120 kPa, then it is chosen to refine the measurement by using the second scale subrange 71" and the second measurement function 61'''. As can be seen, it is possible to increase the resolution without necessarily having a one single measurement function in the global scale range 70.

Notably, the different measurement functions 61', 61", 61''' of FIG. 5*b* in the three scale subranges 71', 71", 71''', respectively, are generally obtained by opportunely choosing the offset 11 and the gain 14 provided to the analog circuitry 50. It will be shown that precise values of the offset information 11 and of the gain information 14 may be obtained, for example, by calibration. Even though in theory the gains of the three measurement functions 61', 61" and 61''' are ideally the same, they notwithstanding may need to be calibrated by virtue of the possible non-idealities (e.g., non-linearities of the amplifier 402). On their side, the offsets are chosen very different for different scale subranges (different measurement functions). Also, the offsets may be obtained by calibration.

Figure 5D:
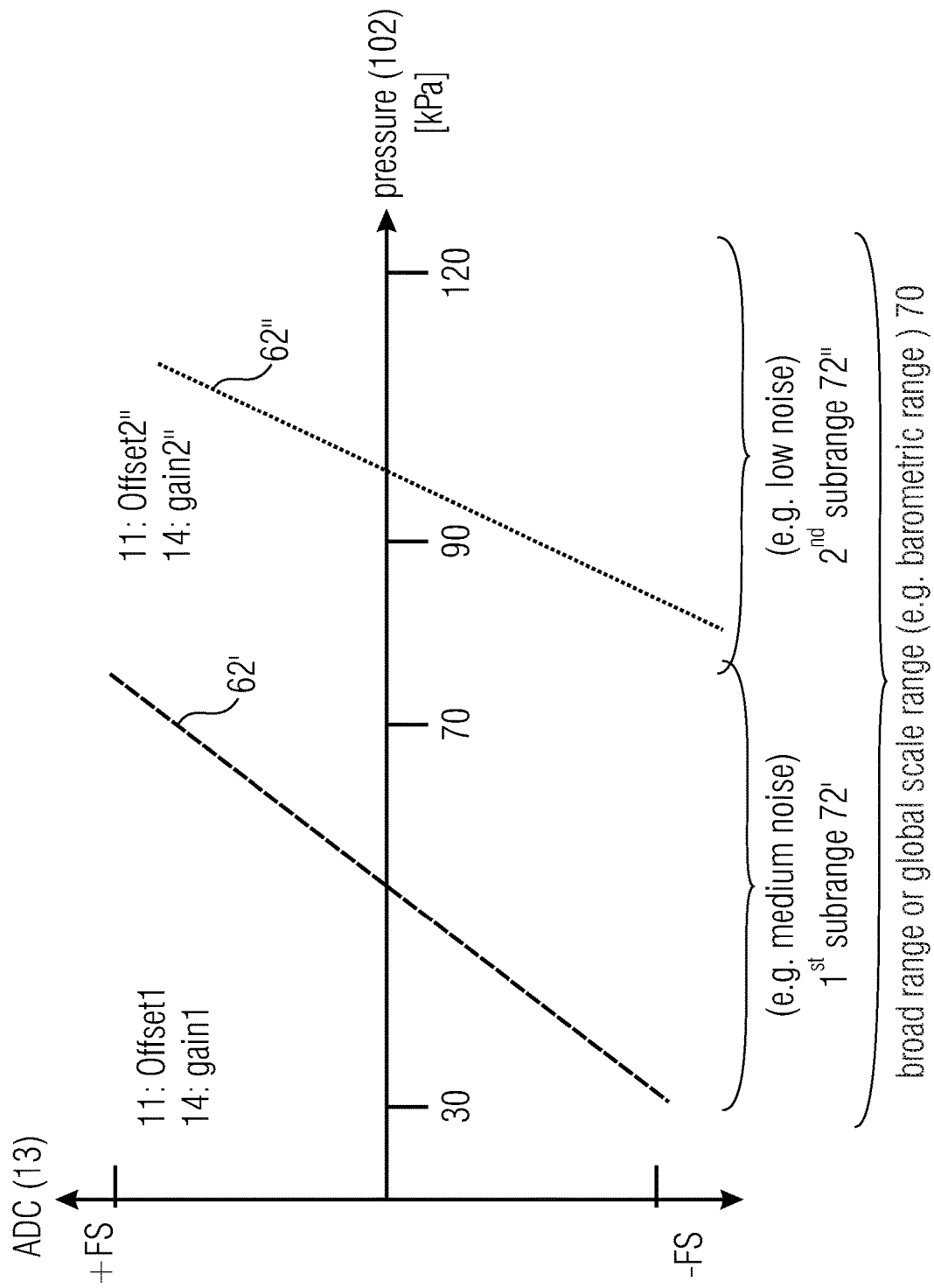
Figure 5E:
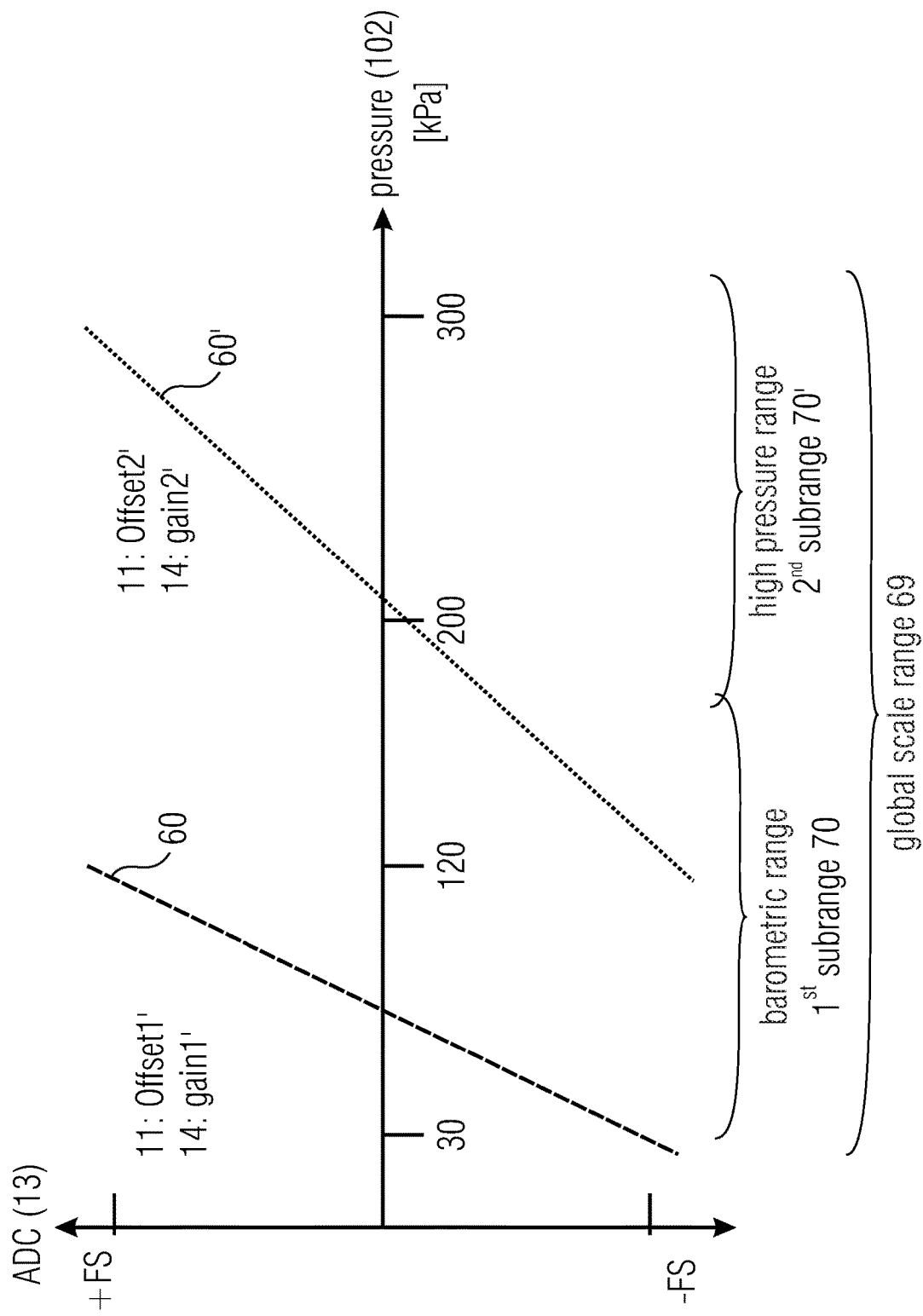

FIG. 5*e* shows a global scale range 69, which is between 30 kPa and 300 kPa and is divided among the first scale subrange (which is a barometric range 70, between 30 kPa and slightly more than 120 kPa) and a second scale subrange 70' (which is a high pressure range 70', here between slightly less than 120 kPa and 300 kPa). The first scale subrange 70 of the global scale range 69 may actually be the same of the barometric range 70 of FIG. 5*e*. This shows that it is possible that a global scale range (e.g., 69 in FIG. 5*e*) is subdivided into different scale subranges (e.g., 70, 70' as in FIG. 5*e*) and at least one of the scale subranges (e.g., the barometric range 70 in FIG. 5*e*) may be, in turn, also subdivided among multiple scale subranges (e.g., scale subranges 71', 71", 71''' in FIG. 5*c*). In general terms, therefore, it is possible to recursively define subdivisions of the scale subranges, to iteratively render more and more narrow the width of the scale subrange. Therefore, it could be possible to start from a measurement using the global scale range 69 and, after having determined that the measurement is within 30 kPa and 120 kPa, to choose a measurement function 60 in the barometric range 70, and more subsequently, after having determined that the measurement is between 30 and 60 kPa, to choose the first range 71' and the first measurement function 61'. On the other side, if it is determined that the measurement value is in a scale subrange 70', the subsequent measurement can be performed in the second scale subrange 70' (e.g., by using the measurement function 60'). It is to be noted that in FIG. 5*e* the measurement function 60 appears to have a higher slope than in FIG. 5*b* only because of the scale of the drawing in ordinate.

FIG. 5*e*, notwithstanding, shows that it is also possible to have gains that are very different from each other into different scale subranges (e.g., the gain for the measurement function 60 in the barometric range 70 is higher than the gain for the measurement function 60' for the high pressure range 70'). It is not a problem to have different measurement functions 60 and 60' in different scale subranges with different gains (e.g., gain1' for the barometric range 70; gain2' for the high pressure range 70'). For example, in FIG. 5*d* in the lower pressure scale subrange 72' there is a measurement function 62', which has a lower gain than the second measurement function 62" associated to the second, higher pressure scale subrange 72". As will be shown later, the second measurement function 62" permits to have a lower noise with respect to the first scale subrange 62, which has a lower gain (it will be explained that the higher the gain, the lower the noise).

Therefore, as shown in FIGS. 5*b*-5*e*, there can be several choices for performing the measurements in large scale ranges or in smaller scale ranges.

In general terms, it is to be noted that the global scale range may be subjected to a subdivision into a plurality of scale subranges, which are proper subranges of the global scale range: this implies that there may be avoided a situation in which a scale subrange is exactly the same of the global scale range. Moreover, the scale subranges are different from each other (in other terms, the scale subranges are such that one first scale subrange is different from one second scale subrange). Hence, there may be avoided a situation in which different scale subranges are actually the same scale subrange. In the same subdivision at least one couple of subranges (a first and a second scale subranges) is such that the first scale subrange is not a proper subrange of the second subrange, and vice versa. Therefore, for each subdivision at least one scale subrange has at least some measurement values which are not in another scale subrange and vice versa. In some examples, in the same subdivision no scale subrange is a proper subrange of any other scale subrange. Hence, even though in one subdivision the scale subranges are proper subranges of the global scale range, it does not happen that, for at least one couple of scale subranges in the same subdivision one scale subrange contains another scale subrange (at least in the same subdivision).

In some examples, it is however possible to nest different subdivisions one into another one, an/or it is also has different subdivisions at the same ranking. For example:

A first-rank subdivision may be as shown in FIG. 5*e*, in which the global scale range 69 is subdivided onto two scale subranges 70 (barometric subrange) and 70' (high pressure subrange).

A first second-rank subdivision is shown in FIG. 5d, showing that the scale subrange 70 is in turn subdivided into three different scale subranges 72' and 72").

A second second-rank subdivision is shown in FIG. 5c, showing that the scale subrange 70 is in turn subdivided into three different scale subranges 71', 71", and 71'".

Notably, the second second-rank subdivision of FIG. 5c may be chosen instead of the first second-rank subdivision of FIG. 5d, according to a user's selection and/or according to a particular choice by the controller 10.

For each subdivision, the different scale subranges can, notwithstanding, have a non-void intersection with each other. For example, in FIG. 5d the scale subranges 71' and 72" can have some common intersections. In FIG. 5e, the scale subranges 70 and 70' are shown as having a non-void intersection approximately at 120 kPa. There can be choosing strategies for choosing which scale subrange to use (e.g., by taking into account historical measurements obtained in previous measurements, so as to maintain the previously chosen scale range).

In some examples, however, when a first, rough measurement is performed using a global scale range 70 (or more in general a wide scale range) it is subsequently possible to choose, according to a particular subdivision, a narrower scale subrange, and to perform a more accurate measurement which may also require less noise and/or less power loss and/or better accuracy. In general terms, the narrower the scale range, the higher the gain that can be used.

In general terms, however, the environment sensor 200 (or the controller 10) may be selectable between:
  a broad-subrange mode (or no-subrange mode), in which at least one first analog environmental measurement is performed; and
  a narrow-subrange mode in which the at least one second analog environmental measurement is performed (e.g., after having selected the most appropriated scale subrange, which may be the scale subrange in which the measurement value acquired through the first analog environmental measurement lies, so that the second analog measurement, acquired through the second analog environmental measurement, is performed in the most appropriated selected subrange; in another example, the choice between the modes is carried out by selection, e.g., though use's selection).

In the broad-subrange mode (or no-subrange mode) the global scale range may be subdivided in less scale subranges than in the narrow-subrange mode (or not subdivided in scale subranges at all) and at least the majority of the scale subranges in the broad-subrange mode (or no-subrange mode) is broader than the scale subranges in the narrow-subrange mode. For example, when operating in the global scale range, the environmental sensor 200 may be in no-subrange mode (or broad-range mode); when operating in narrow-range mode, the sensor 200 may have one selected subrange (among multiple subranges) chosen by selection or according to the measurement value read in the -subrange mode (or no-subrange mode).

It is possible to understand that the global scale range is partitioned (or segmented) into a plurality of subranges.

Each scale range (and each measurement function) may be associated, for example, with the zero-crossing point in which the measurement function crosses the ordinate (i.e., ADC=0 in FIGS. 5a-5e) and the point in which the measurement function crosses the ordinate (e.g., the point −FS in FIGS. 5a-5e).

With main reference to FIG. 5a, there is explained a way through which it is possible to modify one measurement function 64 to obtain another measurement function (e.g., calibrated measurement function) 64". As can be seen, the measurement function 64 may be modified, e.g., by providing an offset to obtain the measurement function 64'. The offset may be the offset 11 as provided by the controller 10 to the analog circuitry 50 (or more precisely, the pressure sensor unit 100). Further, by applying a suitable gain to the measurement function 64', it is possible to obtain the calibrated measurement function 64" in the particular offset 11 and in the particular gain 14.

For example, it may be imagined that the measurement function 64 is the function which is naturally obtained by the pressure sensor unit 100 and by the amplifier 402 without giving any offset information 11 and any gain information 14, while the measurement function 64" is the measurement function after calibration. The calibration session will be discussed below.

Figure 7:
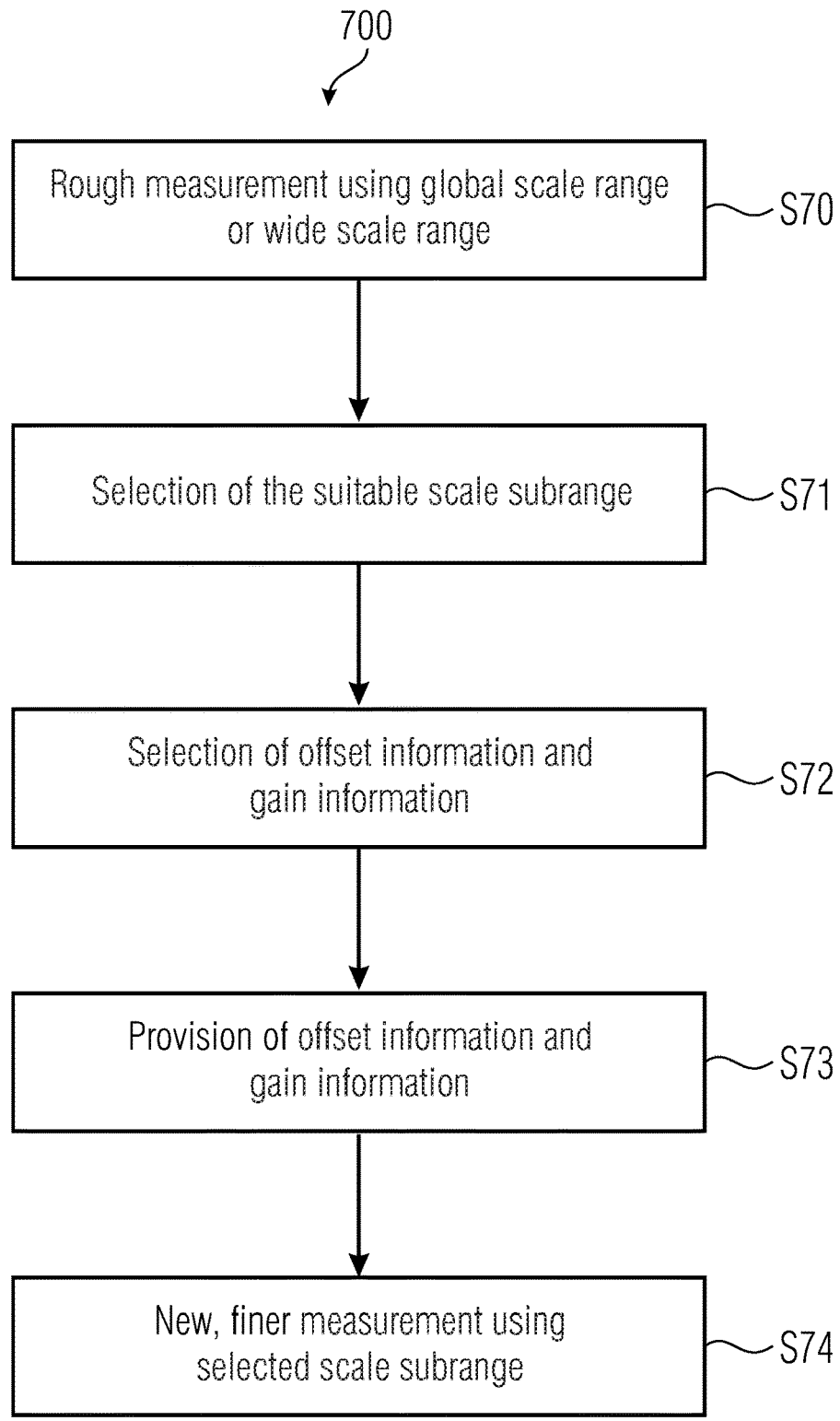
FIGS. 7 and 8 show operational methods according to examples.

FIG. 7 shows an example of operation 700 of the environmental sensor 200, e.g. under the control of the controller 10. For example, at step S70, a rough measurement in the global scale range (or a wide scale range) is performed (the controller 10 being in broad-subrange mode or no-subrange mode). At step S71, a selection of a suitable scale subrange may be performed. For example, the controller 10 may determine that the measurement value 13 lies in a particular scale subrange of the global scale range. In FIG. 5c, for example, the controller 10 may determine that the measurement value 13 lies in the first subrange 71', and therefore the controller 10 may select the first subrange 71'. When the suitable subrange (e.g., 71') is selected, at step S72 it is possible to select the offset information 11 and gain information 14. The offset information 11 and gain information 14 may, for example, be pre-stored in the memory 400 and may have been obtained during the calibration session (see below). Subsequently, at step S73 the offset information 11 and the gain information 14 may be provided to the analog circuitry 50. At step S74, at least one second measurement may be performed using the selected subrange (e.g., 71'), which may provide a second digital measurement value 13 (subsequently corrected as value 208).

In the alternative examples in which the choice of the scale subrange is made by selection (e.g., user's selection), step S71 may be avoided, and step S71 is substituted by a step of obtaining the selection (e.g., user's selection, e.g. from input 210' in FIG. 3).

Figure 8:
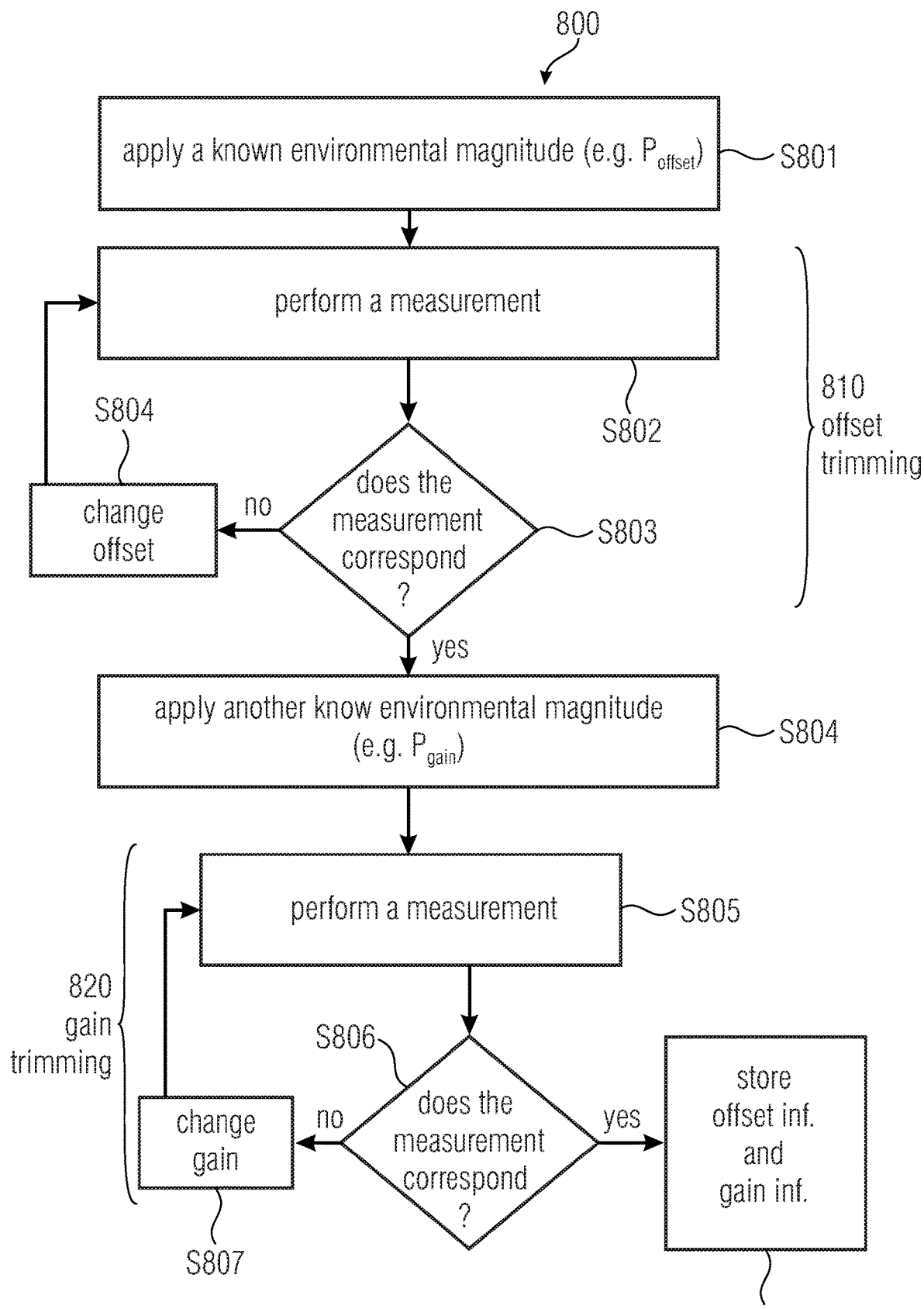

FIG. 8 shows an example of calibration session 800, e.g. also keeping into account to FIG. 5a. it is noted that the instantiation shown in FIG. 8 can be repeated for each subrange (e.g., 71', 71", 71'"). Here, two different known environmental magnitudes (e.g., two different pressures 102) may be measured, both the two different known environmental magnitudes (first and second known environmental magnitudes) being in a particular scale subrange (or more in general in a scale range), and both the two different environmental magnitudes being associated to particular nominal digital values that they should have. E.g., in the abscissa of FIG. 5a, the two pressures could be $P_{offset}$ and $P_{gain}$, which should correspond to two particular scalar values, such as 0 and −FS (other values could be chosen. The configuration session 800 may be based, in particular, on applying at least a first known environmental magnitude (e.g., $P_{offset}$ in FIG. 5a) in step S81. After that, a first trimming operation (e.g., offset trimming) 810 may be performed. This first trimming operation 810 can be performed, for example, by cycling among multiple measurements by iterating steps S802, S803, and S804. For each measurement performed at step S802, the controller 10 may check whether the obtained digital measurement value 13 corresponds to an intended nominal value which the digital measurement value 13 should have at step S803. For example, with reference to the pressure $P_{offset}$ in FIG. 5*a*, the scalar output 13 of the ADC unit 12 should be 0. If the output 0 is not reached, a different offset 11 may be provided to the analog circuitry 50 (in particular, to the pressure sensor unit 100) and, subsequently, at step S804, a new measurement is performed at a new instantiation of step S802. When the controller 10 finds that the measurement value 13 corresponds to the intended nominal value (e.g., 0), then the first trimming operation 810 (of said trimming) may be concluded. Subsequently, a second trimming operation (e.g., gain trimming) 820 may be performed. The second known environmental magnitude may be sensed by the sensor unit 100. For example, with reference to FIG. 5*a*, the pressure $P_{gain}$ in may be provided. Accordingly, it is possible to perform a cycle between steps S805, S806, and S807, for finding the gain that permits to obtain the intended nominal value corresponding to $P_{gain}$ at the output 13 of the ADC unit 12. Therefore, for each iteration a measurement may be performed at step S805 and the controller 10 may determine, by comparison, whether the measured value obtained at step S805 corresponds to the intended value in the output 13 of the ADC unit 12. If there is not a correspondence yet, then the gain information 14 provided to the amplifier unit 400 is changed at step S807. Subsequently, a new measurement is performed at a new iteration of the gain trimming 810 with a new instantiation of the step of performing a measurement S805. If at step S806 the controller 10 determines that the output 13 of the ADC unit 12 is correct, then the offset information 11 and the gain information 14 can be stored in the memory 204. For example, the pressure $P_{gain}$ should be associated to the nominal value –FS, and the gain trimming 820 main obtain the gain information 14 which causes the pressure $P_{gain}$ to actually be associated to the nominal value –FS. In examples, different techniques can be used to perform the trimming operations 810 and 820. In some cases, the error between the expected, nominal value and the obtained digital measurement 13 is measured, and the subsequent offset information 11 selected at step S804 (or the subsequent gain information 14 selected at step S807) may be chosen in such a way that the error is minimized. In general terms, feedback-based techniques may be used which minimize the error. It is also noted that the error is intended to be minimized, and not necessarily to be zero: the checks at steps S803 and S806 are to be understood as verifying that the obtained measurement value 13 and the nominal expected value are within a confidence interval (e.g., they have a distance which is less than a predetermined, small tolerance value).

Method 800 may be repeated for each subrange of a particular global scale range. Therefore, each measurement function (e.g., 61', 61", 61''' in FIG. 5*c*) may be obtained by repeating the method 800 each time (provided that at least two known pressure values are provided for each measurement function). The calibration sessions 800 may also be performed, in some cases, for the global scale range.

As explained above, there is the possibility of correcting the digital measurement value 13 as obtained at the ADC unit 12 by taking into consideration other environmental magnitudes which cause some errors, as such known. For example, the temperature 302 may also cause errors in reading the pressure. The other errors are corrected by the controller 10 through the correction function 10". Hence, in some examples it is also possible to repeat the calibration session 800 for different temperature magnitudes, so as to obtain the corrections to be applied by the correction function 10".

Figure 4:
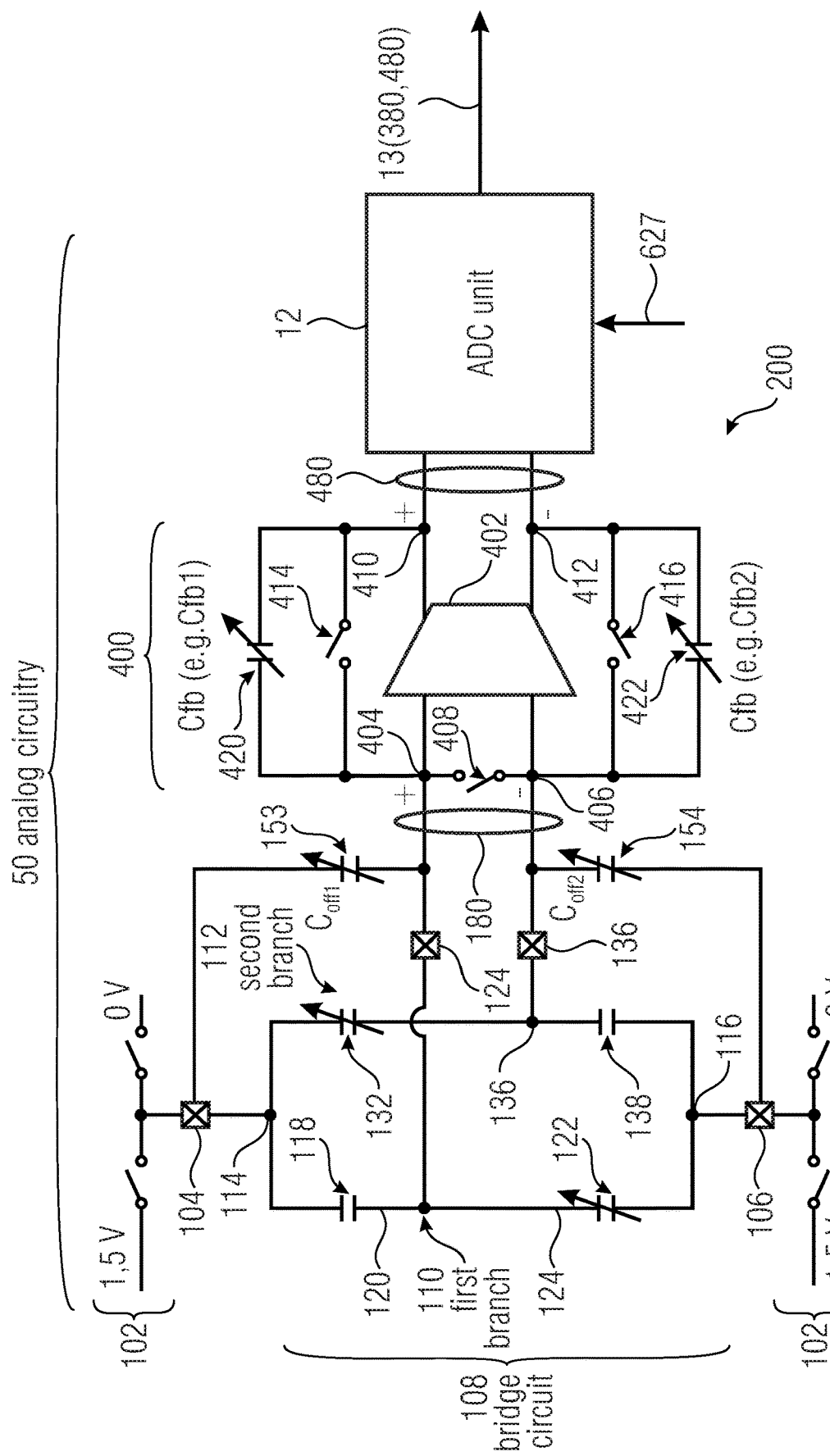

Reference is now made to the pressure sensor unit 100, in particular with FIG. 4. The pressure sensor unit 100 may comprise, for example, electric elements (such as impedance elements, capacitors, resistors, etc.) which are transducers that modify their electric parameter(s) e.g., on the basis of the pressure. In some elements, a variation pressure causes a variation of the electric parameter of the electric element. For example, a variation of the pressure may cause a variation of a capacitance, a resistance, an impedance, etc. This may be in accordance with the particular material, shape, and the particular implementation. The modification of the electric parameters (capacitance, resistance, impedance, etc.) causes the modification of electric magnitudes or signals (currents, voltages), which may therefore be measured (e.g., after an amplification) and used to calculate a digital output 13 or 208 which provides a digital measurement of a pressure. The pressure sensor unit 100 may have a bridge configuration (it could include, for example a capacitive bridge, a Wheatstone bridge, etc.). The pressure sensor unit 100 may be a micro mechanic electric system, MEMS.

The pressure sensor unit 100 may comprise (or be connected to) a signal source 102 with a first signal source terminal 104 and a second signal source terminal 106, to provide a supply signal which may be a differential signal. In examples (e.g., in some cases in which the impedance elements are capacitors or resistors), the signal source 102 may be an AC signal source, wherein the signal (voltage or current) changes over time, e.g., periodically. For example, the first and second signal source terminals 104 and 106 may provide at least one approximatively sinusoidal supply signal. Otherwise, the supply signal may be a square wave signal. For example, during a particular semi-period the voltage potential may be +V>0 at the first signal source terminal 104 and –V<0 at the second signal source terminal 106, while during a preceding and/or subsequent semi period the voltage potential may be –V<0 at the first signal source terminal 104 and +V>0 at the second signal source terminal 106. In examples, (e.g., in some cases in which the impedance elements are resistors) the supply signal could be a DC voltage.

The environmental sensor unit 100 may comprise a bridge circuit 108 (e.g., MEMS bridge circuit). The bridge circuit 108 may have a capacitive-bridge configuration, Wheatstone-bridge configuration, etc. The bridge circuit 108 may have a first branch 110 and a second branch 112. Both the first and second branches 110 and 112 may be supplied by the signal source 102. The first and second branches 110 and 112 may be connected in parallel to each other at a first terminal 114 (connected to the first signal source terminal 104) and at a second terminal 116 (connected to the second signal source terminal 106).

The first branch 110 may comprise a first reference impedance element 118 with impedance $Z_{R1}$ The first reference impedance element 118 may be a first reference capacitance element with capacitance $C_{R1}$ (and $Z_{R1}=1/(2*\pi*f*C_{R1})$, f being the frequency of the fundamental harmonic of the supply signal generated by the signal source 102). In other examples, the first reference impedance element 118 may be a first reference resistor $R_{R1}$ (and $Z_{R1}=R_{R1}$).

The first branch 110 may comprise a first sensor impedance element 122 with first variable impedance $Z_{S1}$. The first sensor impedance element 122 may be a first sensor capacitance element with first variable capacitance $C_{S1}$ (and $Z_{S1}=1/(2*\pi*f*C_{R1})$, f being the frequency of the fundamental harmonic of the supply signal generated by the signal source 102). In other examples, the first sensor impedance element 118 may be a first sensor resistor $R_{S1}$ (and $Z_{S1}=R_{S1}$).

The first reference impedance element 118 may be connected in series to the first sensor impedance element 122. For example:
- a first terminal 114 of the first reference impedance element 118 may be connected to the first signal source terminal 104; and/or
- a second terminal 120 of the first reference impedance element 118 may be connected to a first terminal 124 of the first sensor impedance element 122; and/or
- a second terminal 116 of the first sensor impedance element 122 may be connected to the second signal source terminal 106.

Basically, the terminals 114 and 116 may form an input port inputted by the supply signal generated by the signal source 102. The terminals 114 and 116 may be understood as a supply port which supplies the electric elements of the first branch 110.

The second branch 112 may comprise a second reference impedance element 138 with impedance $Z_{R2}$. The second reference impedance element 138 may be a second reference capacitance element with capacitance $C_{R2}$ (and $Z_{R2}=1/(2*\pi*f*C_{R2})$, f being the frequency of the fundamental harmonic of the supply signal generated by the signal source 102). In other examples, the second reference impedance element 138 may be a second reference resistor $R_{R2}$ (and $Z_{R2}=R_{R2}$).

The second branch 112 may comprise an input port formed by the terminals 114 and 116, and be in parallel to the first branch no. The second branch 112 may comprise a second sensor impedance element 132 with second variable impedance $Z_{S2}$. The second sensor impedance element 132 may be a second sensor capacitance element with second variable capacitance $C_{S2}$ (and $Z_{S2}=1/(2*\pi*f*C_{S2})$, f being the frequency of the fundamental harmonic of the supply signal generated by the signal source 102). In other examples, the second sensor impedance element 132 may be a second sensor resistor $R_{S2}$ (and $Z_{S2}=R_{S2}$).

The second branch 112 may provide a series connection between the second reference impedance element 138 and the second sensor impedance element 132. For example:
- a first terminal 114 of the second sensor impedance element 132 (corresponding to the first terminal 114 of the second branch 112) is connected to the first signal source terminal 104; and/or
- a second terminal 136 of the second sensor impedance element 132 may be connected to a first terminal 136 of the second reference impedance element 138; and/or
- a second terminal 116 of the second reference impedance element 138 may be connected to the second signal source terminal 106.

The output 180 of the bridge circuit 108 (which in examples may also be understood as the output of the pressure sensor unit 100) may be provided by the output terminals 124 and 136: the terminals 124 and 136 (output terminals of the bridge circuit 108) may provide the analog pressure measurement value 180 to be subsequently provided to the amplifier unit 400. The analog pressure measurement value 180 may be a differential signal (e.g., understood as the subtraction between the voltage potential at the terminal 124 and the voltage potential at the terminal 136, or vice versa).

Each of the first and second reference impedance elements 118 and 138 may have at least one electric parameter (e.g., impedance, capacitance, resistance, etc.) which is independent from the pressure 102 (or other environmental magnitude measured by the sensor unit 108). The first and second sensor impedance elements 122 and 132 may be transducers that modify their electric parameters (e.g., impedances, capacitances, resistances, etc.) on the basis of a sensed pressure 102. Therefore, the signals (or differential signal) 180 may permit to obtain a precise measurement of the pressure.

Where the impedance capacitances elements are capacitors, the measured signal 180 (indicated with $v_{180}$) may in principle be:

$$v_{180} \sim C_{R1}+C_{R2}-C_{S1}-C_{S2}.$$

Capacitances $C_{R1}$ and $C_{R2}$ are known a priori, "~" indicates proportionality. Each of $C_{S1}$ and $C_{S2}$ is function of the pressure. Therefore, from the value of the differential signal $v_{180}$ it is possible to obtain a signal 180 which is associated to the pressure.

The impedance of at least one of the reference impedance elements 118 and 138 or sensor impedance elements 122 and 132, or an impedance in a series or in parallel to at least one the reference impedance elements may be selectively modifiable according to the offset information 11 provided by the controller 10. In one example, this is obtained through at least one additional selectable impedance element 153 (and/or 154) in series or in parallel to at least one of the impedance elements 118, 122, 132, and 138. For example, in FIG. 4 a first additional impedance element 153 (which in this case is a capacitor) is in parallel to the first reference impedance element 118 (e.g., between the terminals 104 and 124, or between the terminals 114 and 136). Alternatively or in addition, a second additional impedance element 154 in parallel to the second reference impedance element 138 (e.g., between the terminals 106 and 136, or between the terminals 116 and 136). Accordingly, the formula for the measured signal 180 (indicated with $v_{180}$) becomes:

$$v_{180} \sim C_{R1}+C_{R2}-C_{S1}-C_{S2}+C_{off1}+C_{off2}.$$

If, for example, the two additional capacitors 153 and 154 were added in parallel to the sensor capacitors 122 and 132, respectively, then the value of the output of the bridge circuit 108 would be $$v_{180} \sim C_{R1}+C_{R2}-C_{S1}-C_{S2}-C_{off1}-C_{off2}.$$

Therefore, $C_{off1}$ and $C_{off2}$ form an offset $C_{offset}=C_{off1}+C_{off2}$ which can be associated with the measurement. Therefore, any of $C_{offset}$, $C_{off1}$, $C_{off2}$ may be or be part of the offset information 11 or may be controlled by the offset information 11.

The rule that parallel capacitors sum their capacitances shall be taken into account.

Analogously, it is also possible to put some variable capacitors, for example, in series instead of in parallel. For example, if an additional capacitance $C_{off1}$ is placed in series to a reference capacitance $C_{R1}$, then the series capacitance may become $$\frac{C_{off1} * C_{R1}}{C_{off1} + C_{R1}},$$

following known formulas.

In some examples, the at least one variable additional capacitor 153, 154 may comprise a plurality of capacitor elements, each of them being selectably activated or deactivated by the offset information 11. For example, many capacitor elements may be in parallel to each other, so as to form a big capacitance. However, each of the capacitor elements may be deactivated, e.g. through a capacitor element switch. The more capacitor elements are deactivated (e.g., based on the offset information 11), the lower the capacitance. Therefore, it is possible to choose different values of the capacitance of the variable additional capacitor 153, 154 which may be based on the offset information 11 provided by the controller 10.

The offset information 11 may be therefore information on the capacitance that the at least one additional capacitor (e.g., 153, 154) shall have. Different offsets 11 may therefore be obtained with different capacitances of the at least one variable additional capacitor (e.g., 153, 154). For each value that the offset 11 can have, the capacitance of the at least one variable capacitor (e.g., 153, 154) may be modified accordingly. For example, with reference to FIG. 5c, the additional capacitance $C_{off1}$ may take a first capacitance value when the selected scale subrange is the first subrange 71', and have a second capacitance value, different from the first capacitance value, when the selected scale subrange is the second subrange 71", for example. The same may be applied for any other scale range (e.g., global scale range) or scale subrange in the other FIGS. 5b, 5d, 5e.

Therefore, different offsets 11 (e.g., Offset1, Offset2, Offset3 in FIG. 5c) may be caused by different values of the capacitance of the at least one variable additional capacitor (e.g., 153, 154).

The same may apply to the offsets 11 which are changed at step S804 of the first trimming operation 810 calibration process 800. Step S804 may be actually instantiated by modifying the capacitance (e.g., $C_{off1}$, $C_{off2}$) of the at least one variable additional capacitor (e.g., 153, 154). Therefore, the first trimming 810 may be understood, in some examples, as an operation of finding the value of the capacitance (e.g., $C_{off1}$, $C_{off2}$) of the at least one variable additional capacitor 153, 154 which causes the pressure measurement value 13 obtained at step S802 to correspond to the nominal expected value (e.g., 0 in FIG. 5a) corresponding to the particular known pressure magnitude (e.g., $P_{offset}$ in FIG. 5a). Subsequently, when performing the second trimming operation 820, then the value of the capacitance (e.g., $C_{off1}$, $C_{off2}$) of the at least one variable additional capacitor 153, 154 may be maintained constant.

Therefore, when a measurement is performed (e.g., at S802) the controller may command different capacitances (e.g., $C_{off1}$, $C_{off2}$) of the at least one variable additional capacitor (e.g., 153, 154) according to the particular scale range (global scale range, or the particular scale subrange) which is chosen. Therefore, in operation each variable additional capacitor (e.g., 153, 154) may be selected between at least a first capacitance value, associated to a first scale range (e.g., a first subrange or the global scale range), and a second capacitance value (e.g., a second subrange), the actual values of the at least first and second capacitance values being chosen during a calibration operation 800. Of course, different operation modes (e.g., broad-subrange mode, no-subrange mode vs narrow-subrange mode) in general imply different capacitance value, keeping into mind that also different scale subranges of the same subdivision are subjected to different offsets 11 and therefore to different capacitances (e.g., $C_{off1}$, $C_{off2}$) of the at least one variable additional capacitor (e.g., 153, 154) are accordingly used.

As explained above, in addition or in alternative, one of the reference capacitances 118 and 138 may also be selectively modified, instead of modifying a capacitance in parallel thereto.

All the examples referred to the capacitances may be valid more in general for impedances, and are also in principle valid for resistances and they are therefore not repeated.

In general terms, at least one of the impedance elements is a sensor impedance element (122, 132) configured to transduce an environmental magnitude onto an impedance-related parameter, and at least one of the impedance elements (118, 122) of the first branch (110) and at least one of the impedance elements (132, 138) of the second branch (112) is a reference impedance element (118, 138). The impedance bridge (108) may present a first output terminal (124) at the first branch (110) between the impedance elements (118, 122) of the first pair and a second output terminal (136) at the second branch (112) between the impedance elements (132, 138) of the second pair, so as to provide a differential signal (180) which is an analog environmental measurement value of the environmental magnitude. At least one of the reference impedance elements (118, 138) or sensor impedance elements (122, 132), or an impedance (153, 154) in series or in parallel to at least one of the reference impedance elements (118, 138) or sensor impedance elements (122, 132), is selectably modifiable according to the offset information (11), so as to apply the offset (11).

It is also to be noted that the bridge circuit 108 remains unique for different scale ranges (e.g., global scale range, or multiple scale subranges) and remains unique when operating at any mode (broad-subrange mode, no-subrange mode vs narrow-subrange mode). Therefore, measurements performed using different scale ranges are not performed through different bridge circuits, but they are performed through the same bridge circuit 108 by varying the impedance (e.g., capacitance $C_{off1}$, $C_{off2}$) of the at least one variable additional impedance element (e.g., capacitor 153, 154) according to the offset information 11.

It is to be noted that the capacitive bridge 108 itself can be nonlinear over pressure and temperature. For this, a correction (e.g., by the second correction function 10") in addition to the correction of the non-idealities of the data-path elements may be provided. This may be done on the digital output 208.

The analog circuitry (analog frontend) 50 of the environment sensor 200 may include, as explained above, an amplifier circuit 400. The amplifier circuit 400 may cause the amplification of the analog measurement signal 180 by a gain which is ideally constant. The circuit amplifier 400 may include, for example, an amplifier 402 (e.g., one single amplifier 402). The amplifier 402 may be, for example, an operational transconductance amplifier (OTA) or more in general, an operational amplifier. The amplifier 402 may be even more in general a differential amplifier, which amplifies a differential signal 180 obtained, for example, at input terminals (e.g., 404, 406) of the differential amplifier 402 and may provide, as output 480, an amplified version of the differential input 180. The amplifier 402 may be configured as an integrator (e.g., through at least one feedback capacitor in parallel). The amplifier 402 may have a first input terminal 404 and a second input terminal 406. The amplifier 402 may have a first output terminal 410 and a second output terminal 412. For example, in FIG. 4, the positive terminals may be the first input terminal 404 and the first output terminal 410, while the negative terminals may be the second input terminal 406 and the second output terminal 412. The first input terminal 404 may be connected to the first output terminal 124 of the pressure sensor unit 100 (or more in general the bridge circuit 108). The second input terminal 406 may be connected to the second output terminal 136 of the pressure sensor unit 100 (or the bridge circuit 108). The difference between the voltage potentials between the first and second input terminals 404 (124) and 406 (136) of the amplifier 402 may therefore provide the input analog differential signal 180 provided to the amplifier circuit 400 (or more in particular, to the amplifier 402).

At least one first variable feedback capacitor 420 (Cfb, also indicated with Cfb1) may be connected between an input terminal (e.g., 404) of the amplifier 402 and an output terminal (e.g., 410) of the amplifier 402. For example, a first variable feedback capacitor 420 (Cfb) may be connected between the first input terminal 404 of the amplifier circuit and the first output 410 of the amplifier circuit 400. Therefore, a first terminal 404 of the at least one first variable feedback capacitor 420 may be connected to the output terminal 124 of the first branch 110 of the bridge circuit 108. In addition or in alternative, at least one second variable feedback capacitor 422 (here also indicated with Cfb, also indicated with Cfb1 and which could be different from the capacitance Cfb1 of the first variable feedback capacitor 420) may be connected to an output terminal 412 of the amplifier 402 (or more in general of the amplifier circuit 400). For example, the at least one second variable feedback amplifier 422 may be connected between the second input terminal 406 of the amplifier 402 (or more in general of the amplifier circuit 400) and the second output terminal 412 of the amplifier circuit 400 (or in particular of the amplifier 402).

The first variable feedback capacitor 420 may be in parallel to a switch 414, so that the first variable feedback capacitor 420 is selectably deactivated. In addition or alternative, the second variable feedback capacitor 422 may be in parallel to a second switch 416. The second switch 416 may be connected, for example, between the second input terminal 406 and the second output terminal 412 of the amplifier circuit 400, so that the second variable feedback capacitor 422 can be deactivated. For example, when the switch 414 (or 416) is open, the first variable feedback capacitor 420 (or the second variable feedback capacitor 422) may operate as a capacitor. When the switch 414 (or 416) is closed, the first variable feedback capacitor 420 (or the second variable feedback capacitor 422) may be deactivated. As an addition or in alternative, the input terminals 404 and 406 of the amplifier 402 (or more in general of the amplifier circuit 400) can be connected with each other through a switch 408. When the switch 408 is closed, the voltage potentials at the first and second input terminals 404 and 406 of the amplifier circuit 400 (or more in particular, of the amplifier 402) are the same, and therefore the input differential signal 180 is zero and the output differential signal 480 is zero. The first and second variable feedback capacitors 420 and 422 may provide a capacitive feedback to the amplifier circuit 400. At least one first and/or second variable feedback capacitor 420, 422 may cause the modification of the gain of the amplifier circuit 400. The output 480 of the amplifier circuit 400 (which in FIG. 4 is shown as a differential signal between the voltage potentials at the terminals 410 and 412) may be indicative of the analog measurement of the pressure magnitude 102 (but in an amplified version 480 with respect to the measurement version 180 obtained by the sensor unit 100).

It is not necessary in all the examples that both the first and second variable feedback capacitors 420 and 422 are present: in some examples, only the first variable feedback capacitor 420 is present, and in other examples, only the second variable feedback capacitor 422 is present. The amplifier 402 and at least the first and/or second variable feedback capacitor 420, 422 may constitute, together, an example of programmable gain amplifier (PGA). Other examples of PGA may be provided in other examples. The amplifier circuit 400 of FIG. 4 may be the same of the amplifier circuit 400 of FIG. 1, even though in FIG. 1 no variable feedback capacitors 420, 422 are shown, and even though it is not shown that the amplified measurement 480 of the pressure can be (in some examples) a differential signal. The amplifier circuit 400 may be implemented in one application-specific integrated circuit (ASIC), e.g. in the same chip with the ADC unit 12 (see below).

The values of the variable capacitance Cfb1, Cfb2 of the variable feedback capacitors 420, 422 can be selected by the controller 10. In some examples, the controller 10 may be part of the same integrated circuit in which the amplifier unit 400 and the variable feedback capacitors 420, 422 may be implemented in one single integrated chip. The output 480 (e.g., the differential output between the terminals 410 and 412) may be provided in input to an analog to digital converter (ADC) unit 12. Notably, the values of the capacitance(s) Cfb1 and Cfb2 of the at least one first and/or at least one second variable feedback capacitor 420, 422 may be therefore controlled by the controller 10. The same may apply to the switches (if implemented 408, 414 and 416), each of them may also be controlled by the controller 10.

Notably, what controls the selection on the capacitance(s) Cfb1, Cfb2 of the at least one capacitor 420, 422 may be the gain information 14 provided by the controller 10 to the amplifier circuit 400. In general terms, the greater the capacitance 420 and/or 422, the smaller the gain.

With reference to FIGS. 5a-5e, the slope of the measurement functions (e.g., 60, 61', 61", 61''' . . . ) may be proportional (or anyway based on) an inverse of the capacitance of the capacitor 420 and/or 422 (for example, if there is only the first capacitor 420, the slope of 60 of the measurement function 60 in FIG. 5b may be proportional to 1/Cfb1). In general terms, the higher the capacitance Cfb1, the lower the gain and vice versa. In some cases, instead of one single differential amplifier 402, it is possible to have two different single-ended amplifiers, which constitute one single amplifier.

The values of the capacitance Cfb1, Cfb2 of the feedback capacitor(s) 420, 422 to be taken for each range (e.g., global scale range, or wide scale range, and/or scale subrange) may be obtained for example through the calibration session 800. In particular, the gain trimming cycle 820 may change the values of the capacitance(s) Cfb1, Cfb2 of the variable feedback capacitor(s) 420, 422 at step S807. The change of the gain may change the slope of the measurement function (e.g., in FIG. 5a from the measurement function 64' to the measurement function 64").

Therefore, when a measurement is performed (e.g., at S806) the controller may cause different capacitances (e.g., Cfb1, Cfb2) of the at least one variable feedback capacitor (e.g., 420, 422) according to the particular scale range (global scale range, or the particular scale subrange) which is chosen. Therefore, in operation each variable feedback capacitor (e.g., 420, 422) may be selected between at least a first capacitance value, associated to a first scale range (e.g., a first subrange or the global scale range), and a second capacitance value (e.g., a second subrange), the actual values of the at least first and second capacitance values being chosen during a calibration operation 800. Different operation modes (e.g., broad-subrange mode, no-subrange mode vs narrow-subrange mode) may imply different capacitance values, keeping into mind that, by virtue of the non-ideal linearity of the amplification of the amplifier circuit 400, slightly different gain information 14 may be provided by the controller 10 for different scale ranges (e.g., different scale subranges) even if their measurement functions (e.g., 61', 61", 61'" in FIG. 5c) are supposed to be parallel.

In FIG. 5c, the gains (all indicated with gains) are the same, but this is not necessarily obtained by having the same capacitance(s) Cfb1, Cfb2 at the variable feedback capacitor(s) 420, 422. In non-ideal situations, in fact, the amplifier 402 as such does not involve necessarily an absolutely constant gain, and the calibration operation 800 (in particular, the gain trimming 820) may permit to obtain the correct expected gain.

In some examples, the at least one feedback additional capacitor 420, 422 may comprise a plurality of capacitor elements, each of them being selectably activated or deactivated by the gain information 14. For example, many capacitor elements may be in parallel to each other, so as to form a selectable capacitance (selectable between at least one large capacitance value and at least one small capacitance value, for example). However, each of the capacitor elements may be deactivated, e.g. through a capacitor element switch deactivating each capacitor element. The more capacitor elements are deactivated (e.g., based on the gain information 14), the lower the capacitance, the higher the gain at the amplifier 400, and the higher the slope of the measurement functions of FIGS. 5a-5e. Therefore, it is possible to choose different capacitance values for each of the at least one feedback additional capacitor 420, 422 based on the gain information 14 provided by the controller 10.

The gain information 14 may be therefore information on the capacitance that the at least one variable feedback additional capacitor 420, 422 shall have. Different gains 14 may therefore be obtained with different capacitances of the at least one feedback additional capacitor 420, 422. For each gain that can be selected, a specific capacitance of the at least one the at least one feedback additional capacitor 420, 422 is selected (e.g., at step S72 and/or S73).

All the examples referred to the capacitances may be valid more in general for amplifiers with programmable gain.

In general terms, however, the amplifier circuit 400 (and in particular the amplifier 402) remains the same (unique) for different scale ranges (e.g., global scale range, or multiple scale subranges) and remains unique when operating at any mode (broad-subrange mode, no-subrange mode vs narrow-subrange mode). Therefore, measurements performed using different scale ranges are always amplified by the same amplifier 402, which varies the gain in accordance to the gain information 14 commanded by the controller 10.

Figure 6:
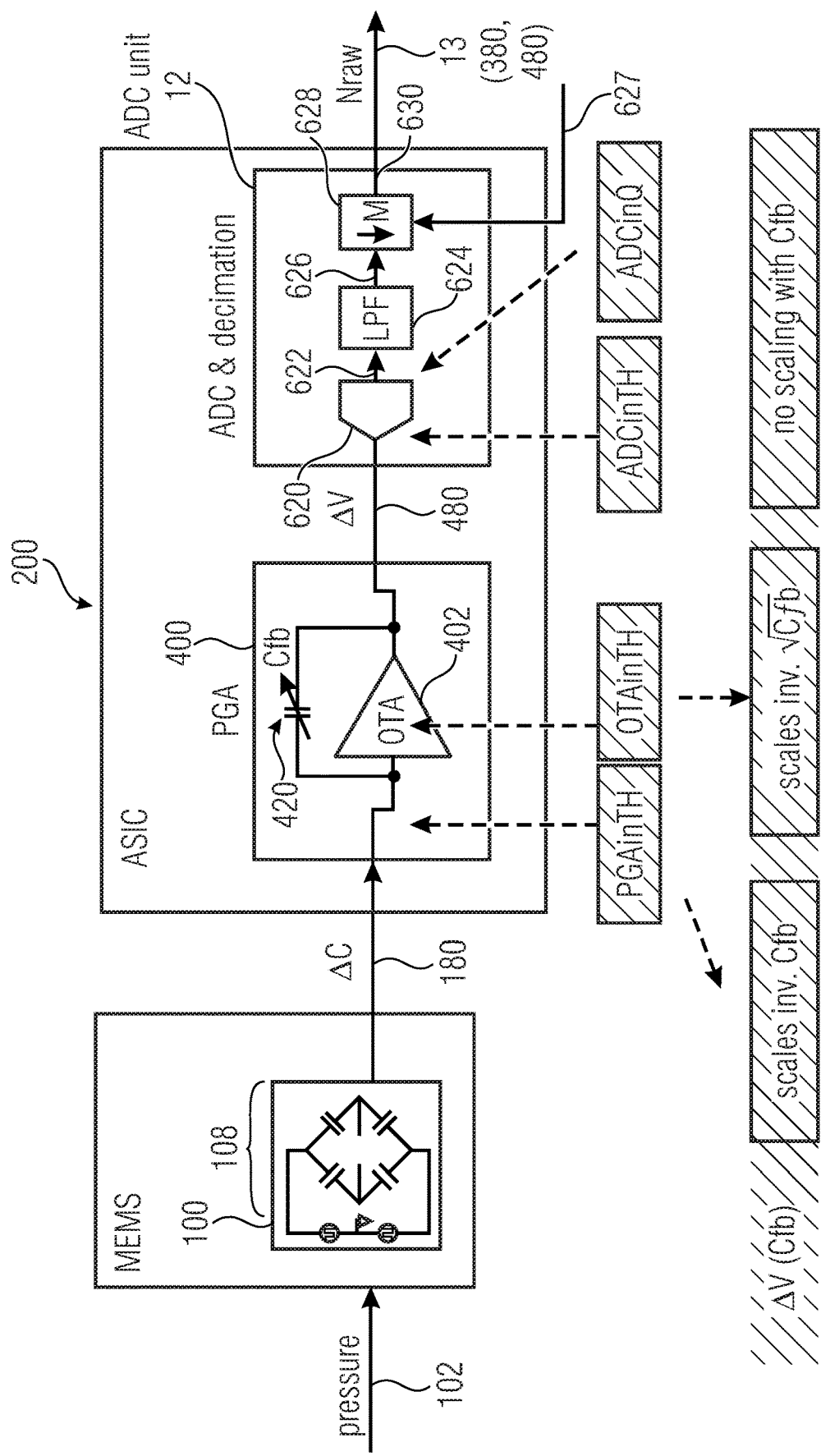

The ADC unit 12 of FIGS. 1, 3, and 4 is described in greater detail in FIG. 6. The ADC unit 12 may provide a digital version 13 of the amplified signal 480 (analog measurement value). The digital version 13 of the analog measurement value 480 may be an adimensional value between −FS and +FS, for example.

The ADC unit 12 may include, for example, an ADC unit 620. The ADC unit 620 may include, for example, a sample-and-hold stage or a track-and-hold stage, which may provide a digital version 622 of the amplified signal 480 (analog measurement value). The output 622 of the ADC unit 620 may be subjected to a low pass filter (LPF) 624. The LPF 624 may implement an anti-aliasing technique. A low-pass filtered version 626 of the measurement value is therefore obtained. Subsequently, a decimation filter 628 (which may be a digital filter) may be applied to the low-pass filtered version 626 of the measurement value 480. The decimation filter 628 may exclude some samples obtained by the ADC unit 620. Notably, the low pass filter 624 already protects from aliasing, and it is therefore possible to reduce the oversampling. Notwithstanding, the decimation filter 624 may modify the oversampling, which also implies a reduction of the computations and of the power consumption. The oversampling rate of the decimation filter 628 may be controlled through an oversampling information 627 provided by the controller 10 (in particular, by the threshold function 10'). In general terms, the ADC unit 12 (and in particular the decimation filter 628) may therefore operate according to different modes:

a first averaging mode in which a first oversampling rate is applied; and a second averaging mode in which a second oversampling rate is applied.

For example, the first averaging mode can have a lower oversampling rate than the second averaging mode. In general terms, if the oversampling rate is low (first averaging mode), this implies that the decimation filter 628 outputs more samples (for the same time unit) than when there is a low oversampling rate (second averaging mode). In general terms, less consumption is implied when the oversampling rate is low, but in that case the noise is also increased. In general terms, the low oversampling rate is used when the gain is increased or it is required to obtain a low-noise pressure measurement value.

It has been noted that a higher gain at the amplifier 402 permits to have a reduced power consumptions, and also permits to use a low oversampling rate (hence, less samples of the digital version 13 of the measurement value 480 are to be processed).

Let us assume that we expect one single value 13 at the output 630 of the ADC 12, that corresponds to a measurement of a pressure. This value is derived from the analog measurement value 480 by analog-to-digital conversion at 620, and then an integration (lowpass filter 624+decimation 628). Depending on the number of samples which are summed up (integrated) at the integration, the noise results low or high. So, the measurement time is proportional to the number of samples which are averaged, which are proportional to the power consumption. Therefore, in general:

Low oversampling rate 627~low number of samples~higher noise~shorter measurement time~lower power consumption.

Higher oversampling rate 627~higher number of samples~lower noise~higher measurement time~higher power consumption.

However, explained above, according to the present examples, the controller 10 may command a high gain 14 (narrow subrange) to the amplifier unit 400, but can command at the same time a low oversampling rate 627 to the ADC 12. Hence, the noise is reduced (by virtue of the higher gain 14), but the power consumption is kept low, by virtue do the lower oversampling rate 627.

It is now explained why a higher gain 14 reduces the power consumption at the amplifier unit 400. Reference can be made to FIG. 6. In order to explain the reduction of the noise, in above figure the noise source model of the readout circuit of the bridge circuit 108 is shown. The OTA noise "OTAinTH" (at the amplifier 402) which is dominant scales with $1/\sqrt{Cfb}$, i.e. the inverse of the square root of Cfb. However, calculated back to the input noise in [aF] or [Pa], this scales with 1/Cfb ("PGAinTH" noise). In other terms, as the input signal 180 (and so the input noise PGAinTH)

scales with 1/Cfb, then the signal level gain is higher than the noise increase of the dominant noise source (OTAinTH).

So, the benefit of having a higher gain 14 (i.e. lower capacitance Cfb of the at least one feedback capacitor, e.g. 420) can be understood. Notably, since the gain cannot be too high (otherwise further non-linearities would be implied) it is possible to choose a maximum gain to be applied to each subrange, and to divide the global scale range into a number of subrange accordingly. The thermal noise "ADCinTH" at the unit 620 and the quantization noise ADCinQ are independent of the capacitance.

By narrowing the width of the scale ranges (e.g., scale subranges), the pressure noise is accordingly reduced more than proportionally.

Figure 9:
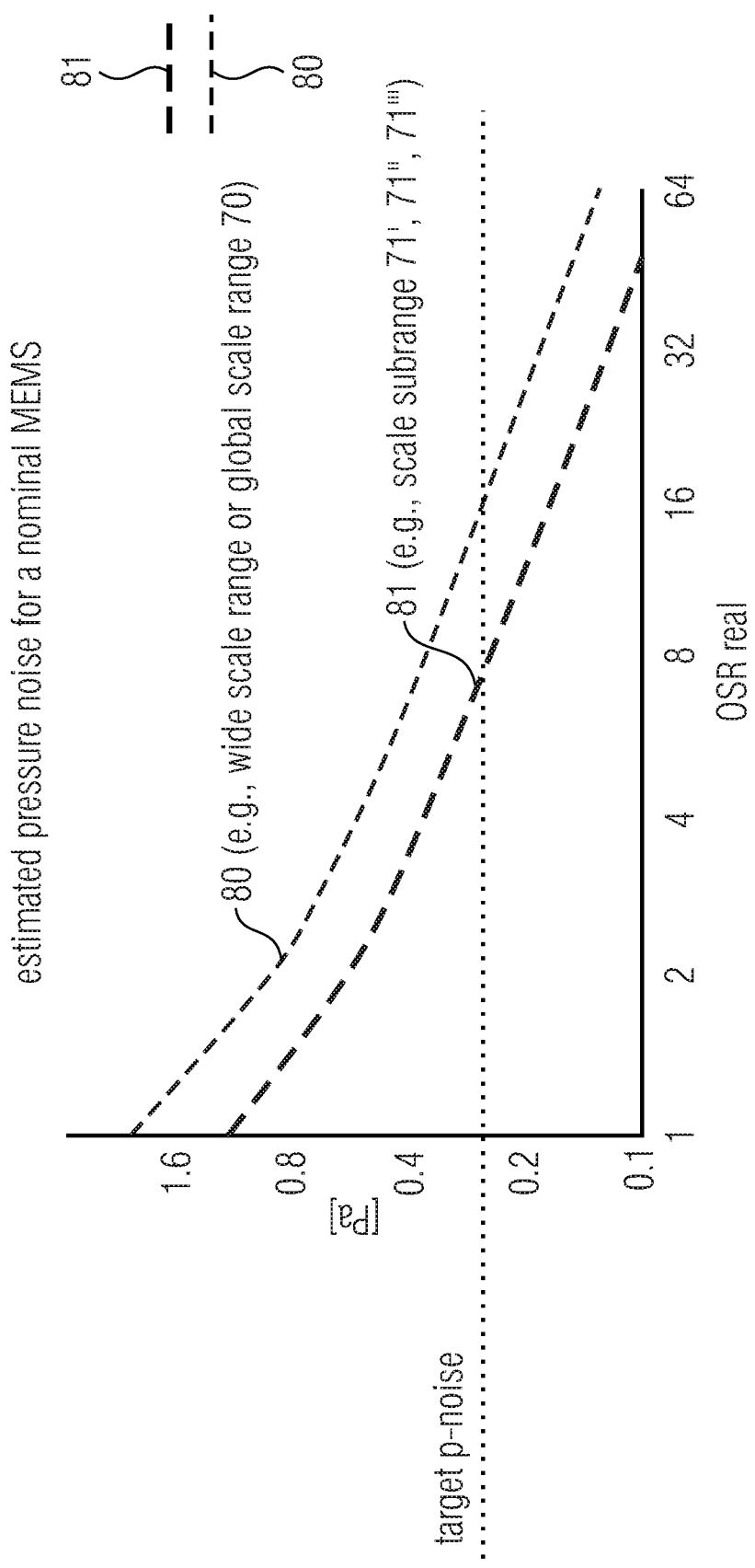
FIG. 9 shows a graphic according to an example.

In the prior art, the reduction of the noise is often obtained by oversampling. However, this causes an increase of the number of computations necessary and an increase of the power consumption. FIG. 9 shows a comparative example of the pressure noise (in Pa) in ordinate against the oversampling rate in abscissa (the oversampling rate being indicative of the power consumption). Numeral 80 refers to the noise measured when the environmental measurement is taken in the barometric range (global scale range) 70 of FIG. 5b. Numeral 81 refers to the noise measured when the environmental measurement is taken in one of the scale subranges 71', 72", 72'". The graphic shows that measurement taken in a reduced scale range (increased gain, reduced capacitance of the feedback capacitor 420, 422) reduce the pressure noise with respect to measurement taken in the global scale range (or more in general of a broader scale range) at parity of oversampling rate. On the other side, at parity of target pressure noise, measurements taken in a reduced scale range require a decreased oversampling rate (and therefore a reduced power consumption) with respect to measurements taken in the global scale range (or more in general of a broader scale range).

FIG. 3 shows an example that can be one of those of FIGS. 1, 2, 4, and 6. As can be seen, the sensor 200 includes an analog circuitry 50 which may include, for example, a bridge 108, a temperature, an amplifying circuit 400 (e.g., with the amplifier 402, which amplifies the differential signal 180 provided by the bridge 108 to provide an amplified measure 480 to the ADC unit 12). FIG. 3 also shows a selector 152 (which in some examples can be part of the controller 10 or can also not be present) which is input by signals 11 and 14 from the controller 10 and provides them to the bridge 108 and to the amplifier 402 (as above). The analog circuitry may also include a temperature sensor unit 300 and/or a humidity sensor unit 310, which respectively provides a temperature measurement 380 and/or a humidity measurement 390. In FIG. 3, there is not shown an analog to digital converter which provides the values 380 and 390 to the controller 10. The controller 10 may include a processing unit 210. The processing unit 210 may include a control unit (e.g., a control processing unit, CPU) 201. The controller 10 may include a memory 204. The memory 204 may include a notion of the global scale range (e.g., barometric range 70) and of the scale subranges (e.g., 71', 71", and 71'"). For each subrange, there may be an indication of, for example, the lower and the upper end, so as it is possible, when performing the first measurement and obtaining the first digital measurement value, it is possible to perform the selection, which is the suitable scale subrange in which the first measurement value lies. This operation can be performed, for example, by a subrange detector 202 (which may be a part or may not be a part of the controller unit 201 or the controller 10) and which decides 203 and which subrange the measurement value 13 lies. Basically, the reference numeral 203 may be understood as referring to the gain information 14 and the offset information 11 to be provided to the analog circuitry. Other possibilities are possible. In some examples, the controller 10 may also implement the correction function 10" shown in FIG. 1.

In examples above, reference is sometimes made to the possibility of controlling the oversampling information 627. In some examples, however, the oversampling may be fixed, and not dynamic. Therefore, the arrow 627 could be avoided is some examples.

The examples above, mostly referring using wording adapted for describing a product, may also be used for describing a method. For example, there may be provided a method for providing digital measurements from analog environmental measurements (380, 480, 580) acquired by analog circuitry (50, 100, 400), the digital measurements lying in a global scale range (70), wherein the global scale range (70) is subjected to a subdivision into a plurality of scale subranges which are proper subranges of the global scale range, wherein the scale subranges are such that one first scale subrange is different from one second scale subrange and the first scale subrange is not a proper subrange of the second scale subrange and the second scale subrange is not a proper subrange of the first scale subrange, the method comprising:

selecting (S71), among the plurality of scale subranges (71', 71, 71"), one scale subrange (71') in which at least one second analog environmental measurement value (380, 480, 580) is to be acquired, selecting (S72) an offset information (11) and a gain information (14) which are associated with the selected scale subrange (71') and which describe an offset (11) and a gain (14), respectively, to be applied by the analog circuitry (50, 100, 400) to perform a second analog environmental measurement in the selected scale subrange; and providing the offset information (11) and the gain information (14) to the analog circuitry (50, 100, 400).

In the present document, when it is referred to that a measurement value "lies" in a particular range or subrange, this be understood as having a mathematic sense: the measurement value can be associated with a mathematic value which is contained in a particular mathematic range (which may be, for example, broader or narrower than the measurement range). On the other side, when a measurement "is performed in" a particular scale range or scale subrange or when a particular scale range or scale subrange "is associated with" a particular offset, this may be understood in the sense that the performed measurement produces a valuable result in that particular scale range or scale subrange (otherwise, for example, a value +FS or −FS is obtained without giving a more precise measurement). Hence, a measurement may be performed which generates a measurement value which lies in a particular range or subrange (which may be different to the measurement range of the performed measurement) and, after having recognized the subrange in which the measurement value lies, it is subsequently possible to find out the offset 11 and the gain 14 associated with a measurement range in which a more precise measurement may be performed.

Depending on certain implementation requirements, examples may be implemented in hardware. The implementation may be performed using a digital storage medium, for example a floppy disk, a Digital Versatile Disc (DVD), a Blu-Ray Disc, a Compact Disc (CD), a Read-only Memory (ROM), a Programmable Read-only Memory (PROM), an Erasable and Programmable Read-only Memory (EPROM), an Electrically Erasable Programmable Read-Only Memory (EEPROM) or a flash memory, having electronically readable control signals stored thereon, which cooperate (or are capable of cooperating) with a programmable computer system such that the respective method is performed. Therefore, the digital storage medium may be computer readable.

Generally, examples may be implemented as a computer program product with program instructions, the program instructions being operative for performing one of the methods when the computer program product runs on a computer. The program instructions may for example be stored on a machine readable medium.

Other examples comprise the computer program for performing one of the methods described herein, stored on a machine-readable carrier. In other words, an example of method is, therefore, a computer program having program-instructions for performing one of the methods described herein, when the computer program runs on a computer.

A further example of the methods is, therefore, a data carrier medium (or a digital storage medium, or a computer-readable medium) comprising, recorded thereon, the computer program for performing one of the methods described herein. The data carrier medium, the digital storage medium or the recorded medium are tangible and/or non-transitionary, rather than signals which are intangible and transitory.

A further example comprises a processing unit, for example a computer, or a programmable logic device performing one of the methods described herein.

A further example comprises a computer having installed thereon the computer program for performing one of the methods described herein.

A further example comprises an apparatus or a system transferring (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some examples, a programmable logic device (for example, a field programmable gate array) may be used to perform some or all of the functionalities of the methods described herein. In some examples, a field programmable gate array may cooperate with a microprocessor in order to perform one of the methods described herein. Generally, the methods may be performed by any appropriate hardware apparatus.

The above described examples are illustrative for the principles discussed above. It is understood that modifications and variations of the arrangements and the details described herein will be apparent. It is the intent, therefore, to be limited by the scope of the impending patent claims and not by the specific details presented by way of description and explanation of the examples herein.

What is claimed is:

1. A controller for an environmental sensor, the environmental sensor providing digital environmental measurement values from analog environmental measurements performed by analog circuitry, the digital environmental measurement values lying in a global scale range or wide scale range, wherein the controller is configured to subject the global scale range or wide scale range to a subdivision into a plurality of scale subranges which are proper subranges of the global scale range or wide scale range, wherein the plurality of scale subranges includes at least one first and one second scale subranges, wherein the first scale subrange is different from the second scale subrange, the first scale subrange is not a proper subrange of the second scale subrange, and the second scale subrange is not a proper subrange of the first scale subrange, the controller being configured to:
select, among the plurality of scale subranges, one scale subrange in which an analog environmental measurement is to be performed,
select an offset information and a gain information which are associated with the selected scale subrange and which are indicative of an offset and a gain, respectively, to be applied by the analog circuitry to perform an analog environmental measurement in the selected scale subrange; and
provide the offset information and the gain information to the analog circuitry.

2. The controller of claim 1, wherein the selected gain information controls at least one gain of an amplifier unit amplifying an analog environmental measurement value, by applying the gain to perform the analog environmental measurement in the selected scale subrange.

3. The controller of claim 2, wherein the selected gain information controls at least one capacitor connecting an input terminal of the amplifier unit and an output terminal of the amplifier unit.

4. The controller of claim 1, configured to receive a digital version of at least one first analog environmental measurement value obtained through at least one first analog environmental measurement performed in the global scale range or wide scale range,
so as to select the scale subrange in which the at least one first analog environmental measurement value lies.

5. The controller of claim 1, selectable between: a broad-subrange mode or no-subrange mode in which at least one first analog environmental measurement is performed; and a narrow-subrange mode in which at least one second analog environmental measurement is performed, wherein in the broad-subrange mode or no-subrange mode the global scale range or wide scale range is subdivided in less scale subranges than in the narrow-subrange mode, or not subdivided in scale subranges at all, respectively, and at least a majority of the scale subranges in the broad-subrange mode or no-subrange mode is broader than the scale subranges in the narrow-subrange mode.

6. The controller of claim 5, configured to provide a gain information indicative of a first gain in the broad-subrange mode or no-subrange mode, and to apply a second gain information indicative of a second gain in the narrow-subrange mode for the second analog environmental measurement, wherein the second gain is higher than the first gain.

7. The controller of claim 1, configured to perform a calibration session in which a plurality of analog environmental measurements are performed and a plurality of resulting analog environmental measurement values are compared with expected values, and the gain information and the offset information are iteratively varied, to obtain the offset information and the gain information for at least one scale subrange of the plurality of scale subranges.

8. The controller of claim 1, configured to perform a calibration session in which there are obtained the offset information and the gain information to be subsequently applied for performing analog environmental measurements in a given scale subrange, wherein the calibration session comprises:
an offset trimming cycle in which at least one first known environmental magnitude is applied, the offset trimming cycle including performing measurements on the at least one known environmental magnitude and comparing the obtained measurement values to an expected value, so as to obtain the offset information;

a gain trimming cycle in which at least one second known environmental magnitude, different from the at least one first known environmental magnitude, is applied, the gain trimming cycle including performing measurements on the at least one second known environmental magnitude and comparing the obtained measurement values to an expected value, so as to obtain the gain information, wherein both the at least one first known environmental magnitude and the at least one second known environmental magnitude lie in the given scale subrange.

9. The controller of claim 1, wherein the selected offset information controls a variable impedance in the analog circuitry, so as to apply the offset which causes the analog environmental measurement to be performed in the selected scale subrange.

10. The controller of claim 1, further configured to provide an oversampling rate information indicative of an oversampling rate of an analog-to-digital converter, ADC, so that an increased gain corresponds to a reduced oversampling rate, and a reduced gain corresponds to an increased oversampling rate.

11. An environmental sensor for providing digital measurement values of environmental magnitudes, comprising:
an analog circuitry, configured to provide analog environmental measurement values of environmental magnitudes obtained through measurements performed at least in one of the plurality of scale subranges;
an analog-to-digital converter, ADC, unit, configured to convert the analog environmental measurement values onto digital versions of the analog environmental measurement values;
a controller according to any of the preceding claims, configured to:
select, among the plurality of scale subranges, the one scale subrange in which the at least one analog environmental measurement is to be performed,
select the offset information and the gain information which are associated with the selected scale subrange and which describe the offset and the gain, respectively, to be applied by the analog circuitry to perform the at least one second analog environmental measurement in the selected scale subrange; and
provide the offset information and the gain information to the analog circuitry,
so that the analog circuitry applies the offset and the gain to the second analog environmental measurement in the selected scale subrange, so as to obtain at least one analog environmental measurement value lying in the selected scale subrange and a digital version of the at least one analog environmental measurement value lying in the selected scale subrange.

12. The environmental sensor of claim 11, wherein the analog circuitry comprises an impedance bridge having a first branch with a first pair of impedance elements and a second branch with a second pair of impedance elements,
wherein at least one of the impedance elements is a sensor impedance element configured to transduce an environmental magnitude onto an impedance-related parameter, and at least one of the impedance elements of the first branch and at least one of the impedance elements of the second branch is a reference impedance element,
wherein the impedance bridge presents a first output terminal at the first branch between the impedance elements of the first pair and a second output terminal at the second branch between the impedance elements of the second pair, so as to provide a differential signal which is an analog environmental measurement value of the environmental magnitude,
wherein at least one of the reference impedance elements, or an impedance element in series or in parallel to at least one of the reference impedance elements or sensor impedance elements, is selectably modifiable according to the offset information, so as to apply the offset.

13. The environmental sensor of claim 11, wherein the analog circuitry comprises an amplifier to amplify an analog environmental measurement, and a variable feedback capacitor connecting an input terminal of the amplifier to an output terminal of the amplifier, wherein the gain information controls the capacitance of the variable feedback capacitor, so that an increase of the gain is caused by a reduction of the capacitance of the variable feedback capacitor.

14. The environmental sensor of claim 11, selectable between:
a broad-subrange mode or no-subrange mode; and
a narrow-subrange mode,
wherein in the broad-subrange mode or no-subrange mode the global scale range or wide scale range is subdivided in less scale subranges than in the narrow-subrange mode, or not subdivided in subranges at all, respectively, and
at least a majority of the scale subranges in the broad-subrange mode is broader than the scale subranges in the narrow-subrange mode.

15. The environmental sensor of claim 14, wherein the ADC unit is configured to operate at a first averaging mode which implies a lower oversampling rate in the narrow scale subrange mode than the oversampling rate in the broad-subrange mode or no-subrange mode.

16. A method for providing digital measurements from analog environmental measurements acquired by analog circuitry, the digital measurements lying in a global scale range or wide scale range, wherein the global scale range or wide scale range is subjected to a subdivision into a plurality of scale subranges which are proper subranges of the global scale range or wide scale range, wherein the scale subranges are such that one first scale subrange is different from one second scale subrange and the first scale subrange is not a proper subrange of the second scale subrange and the second scale subrange is not a proper subrange of the first scale subrange, the method comprising:
selecting, among the plurality of scale subranges, one scale subrange in which at least one second analog environmental measurement value is to be acquired,
selecting an offset information and a gain information which are associated with the selected scale subrange and which describe an offset and a gain, respectively, to be applied by the analog circuitry to perform a second analog environmental measurement in the selected scale subrange; and
providing the offset information and the gain information to the analog circuitry.

17. A non-transitory storage unit storing instructions which, when executed by a computer, cause the computer to perform the method of claim 16.

* * * * *